United States Patent
Yokoyama et al.

(10) Patent No.: US 7,326,457 B2
(45) Date of Patent: Feb. 5, 2008

(54) SUBSTRATE HOLDING DEVICE INCLUDING ADHESIVE FACE WITH HEXAGONS DEFINED BY CONVEX PORTIONS

(75) Inventors: Naoto Yokoyama, Matsusaka (JP); Mitsuaki Morimoto, Matsusaka (JP); Makoto Nakahara, Nara (JP); Takao Murayama, Nagareyama (JP); Akira Hirai, Ushiku (JP); Satoshi Yawata, Kitakannbara-gun (JP)

(73) Assignee: Hitachi Plant Technologies, Ltd., Tokyo (JP)

( * ) Notice: Subject to any disclaimer, the term of this patent is extended or adjusted under 35 U.S.C. 154(b) by 469 days.

(21) Appl. No.: 10/506,636

(22) PCT Filed: Feb. 17, 2003

(86) PCT No.: PCT/JP03/01674

§ 371 (c)(1),
(2), (4) Date: Sep. 3, 2004

(87) PCT Pub. No.: WO03/075343

PCT Pub. Date: Sep. 12, 2003

(65) Prior Publication Data

US 2005/0167036 A1    Aug. 4, 2005

(30) Foreign Application Priority Data

Mar. 5, 2002   (JP) .............................. 2002-059462
Oct. 31, 2002  (JP) .............................. 2002-318911

(51) Int. Cl.
   *B32B 31/00*   (2006.01)
(52) U.S. Cl. ........................ 428/118; 156/382; 269/21; 428/141; 428/355 BL

(58) Field of Classification Search ................ 428/118, 428/141, 355 BL; 156/382; 269/21
See application file for complete search history.

(56) References Cited

U.S. PATENT DOCUMENTS

| | | | |
|---|---|---|---|
| 5,407,519 A * | 4/1995 | Joffe et al. ................... | 156/382 |
| 5,531,835 A | 7/1996 | Fodor et al. | |
| 5,650,215 A * | 7/1997 | Mazurek et al. ...... | 428/355 BL |
| 5,869,150 A | 2/1999 | Iwamoto | |
| 6,037,026 A | 3/2000 | Iwamoto | |
| 6,197,397 B1 * | 3/2001 | Sher et al. ................. | 428/40.1 |
| 2002/0036373 A1 | 3/2002 | Kosakai | |

FOREIGN PATENT DOCUMENTS

| | | |
|---|---|---|
| EP | 0 683 505 A1 | 5/1995 |
| JP | 61-207035 | 12/1986 |
| JP | 08-068993 | 3/1996 |
| JP | 2001-051284 | 2/2001 |
| JP | 2001-133745 | 5/2001 |
| JP | 2001-341043 | 12/2001 |

OTHER PUBLICATIONS

Japanese Office Action dated May 22, 2007.

* cited by examiner

*Primary Examiner*—Steven D. Maki
(74) *Attorney, Agent, or Firm*—David G. Conlin; Steven M. Jensen; Edwards Angell Palmer & Dodge LLP

(57) ABSTRACT

In a method of the present invention for holding a substrate in a vacuum, a glass substrate (5) is held by an adhesive pad (20) or an adhesive sheet, both of which are made from a material containing a diene based resin, whereby an adhesive agent is prevented from remaining on the substrate, and the adhesive sheet can be detached with ease from the substrate after assembling the substrates.

8 Claims, 20 Drawing Sheets

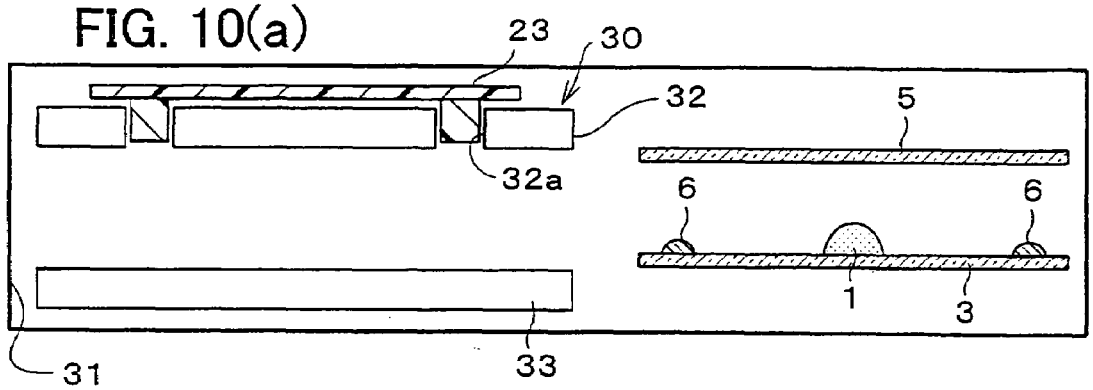
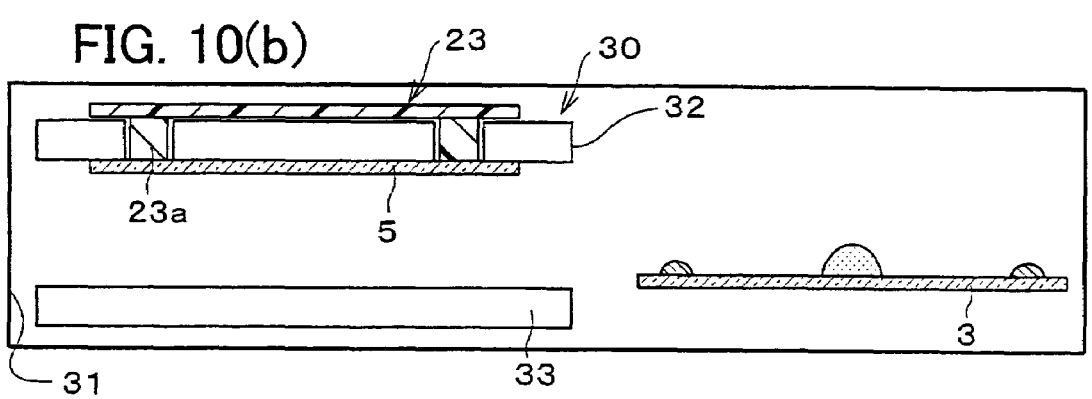
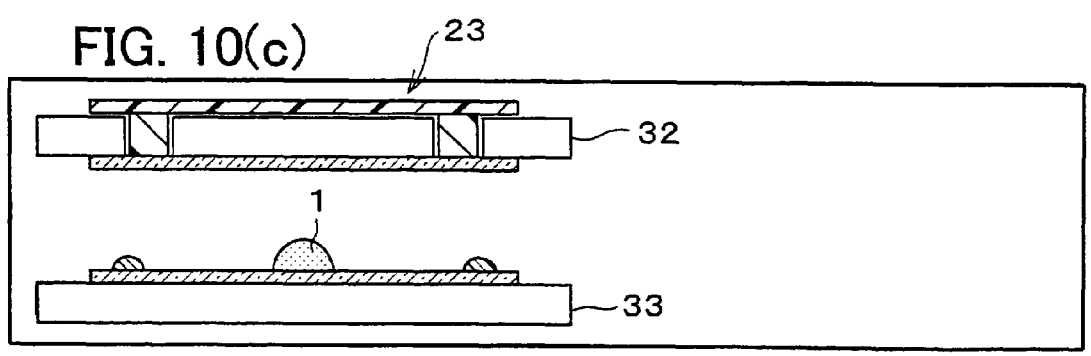
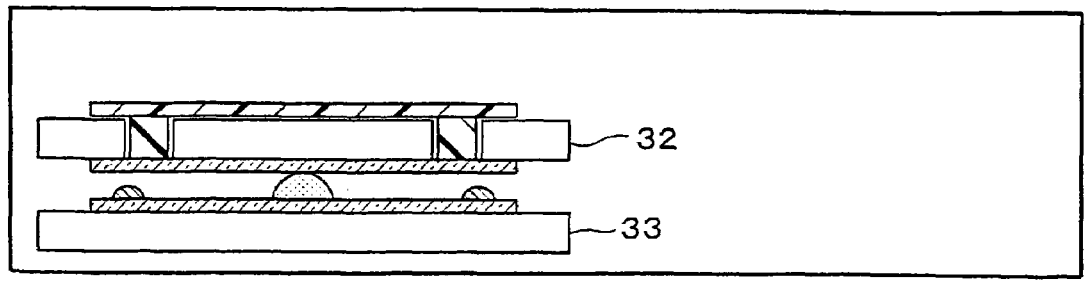

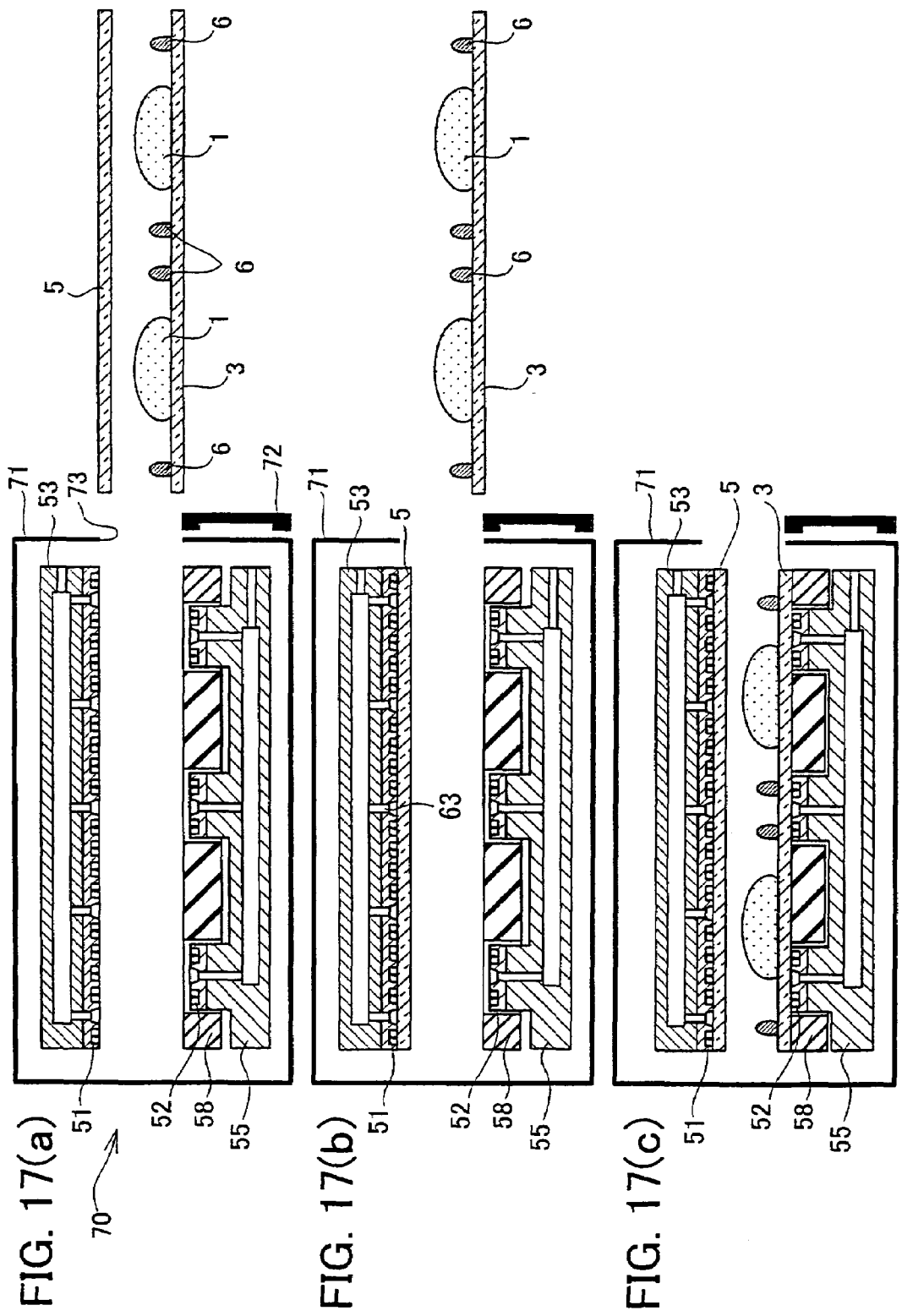

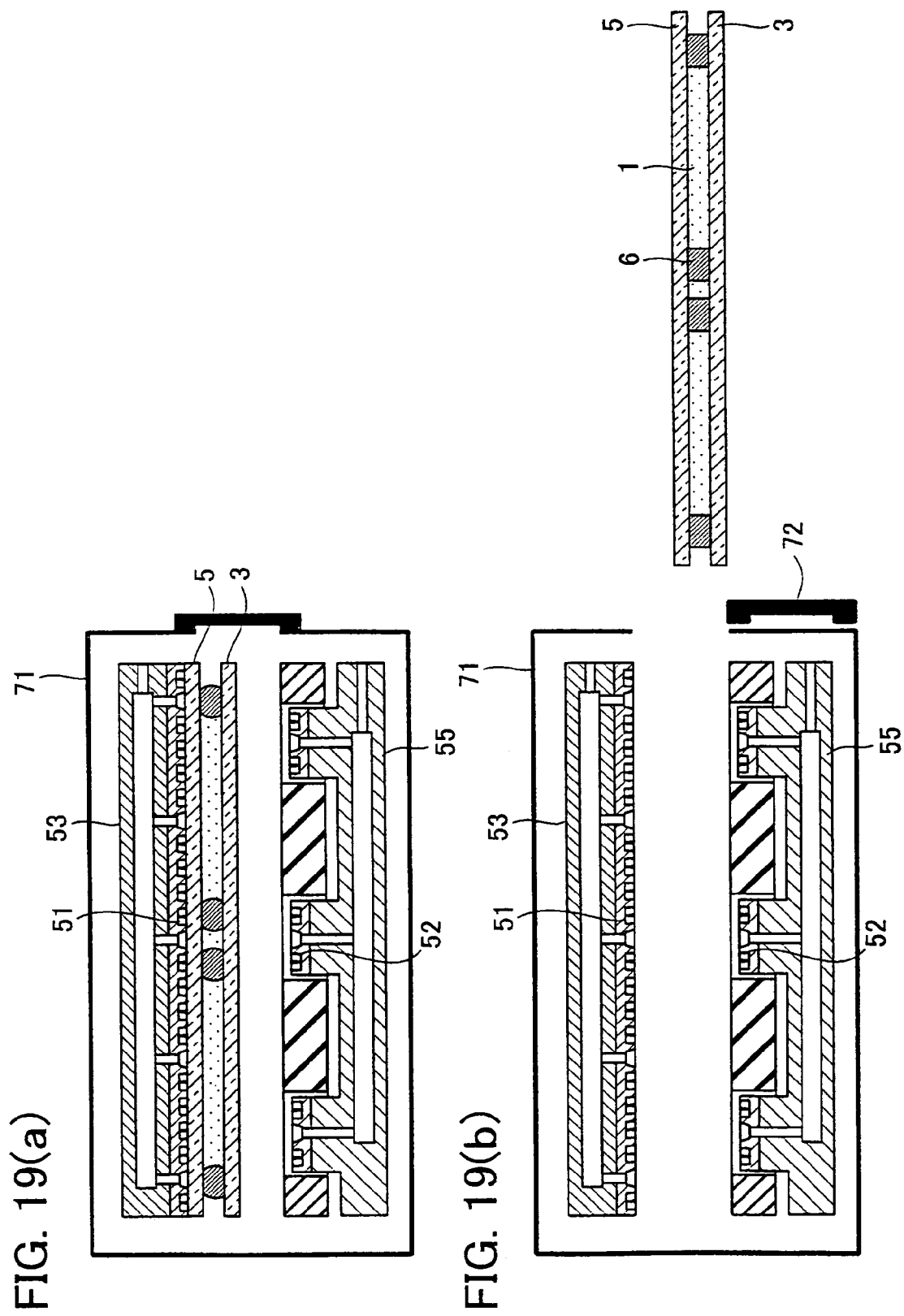

SUBSTRATE HOLDING DEVICE INCLUDING ADHESIVE FACE WITH HEXAGONS DEFINED BY CONVEX PORTIONS

TECHNICAL FIELD

The present invention relates to (i) a method for holding a substrate in a vacuum when two substrates are assembled together in a vacuum, (ii) a method for manufacturing a liquid crystal display device, and (iii) a substrate holding device.

BACKGROUND ART

In manufacturing a liquid crystal display panel, two glass substrates with a transparent electrode, a thin film transistor array, and the like need to be assembled together with a sealing material by leaving a very narrow space in the order of several µm between each other, and by filling the space with liquid crystal and sealing it.

Here, conventionally, for example, a method described below is used for filling and sealing the liquid crystal.

Firstly, under ordinary pressure, a sealing material having an opening for injecting the liquid crystal is formed around the periphery of a cell in one of two substrates, and then the two substrates are assembled, pressed, and hardened. Next, the assembled substrates are cut into a predetermined cell size or the like, so that the injection opening is on the glass edge. After that, the cells of a predetermined cell size are sealed after injecting the liquid crystal through the injection opening by a conventional liquid crystal injection method.

In the method for injecting the liquid crystal the step of assembling the two substrates and the step of injecting the liquid crystal needs to be separately performed. However, in recent years, the step of assembling the two substrates together and the step of injecting the liquid crystal have been performed simultaneously. This is enabled by assembling the two substrates in a vacuum after dropping the liquid crystal onto the substrate on which the sealing material has been applied.

Specifically, the injection of liquid crystal in the vacuum device used in this example is carried out in a vacuum so that the two substrates are assembled together by applying the sealing material to one of the substrates that is to be assembled, and by dropping the liquid crystal onto one of the substrates.

Incidentally, when the liquid crystal is dropped and the substrates are assembled in a vacuum as above, the following problems are caused.

First, a vacuum suction method cannot be used for holding an upper substrate, because the injection step is performed in the vacuum device. Also, in cases where an electrostatic chuck is used to hold the substrate, characteristics of TFTs (Thin Film Transistors) formed on the substrate are changed due to a high voltage applied when holding the substrates.

To solve these problems, for example, Japanese Laid-Open Patent Application Tokukai 2001-133745 (published on May 18, 2001) proposes an adhesive material such as an adhesive sheet for holding the substrates in a vacuum.

This method ensures the substrates to be easily assembled together in vacuum with high accuracy even for large and thin substrates.

However, in the conventional method disclosed in this publication, a type of adhesive sheet used for holding the substrate in a vacuum is not specifically described.

Generally, the adhesive sheet may be a tape or the like to which an adhesive agent has been applied. However, in cases where the substrate is held by such a tape, there is a problem that the adhesive agent remains on the substrate. Further, in cases where the adhesion is too strong, the adhesive sheet cannot be detached from the substrate. This may cause damage on the substrate when the adhesive sheet is detached from the substrate.

Further, the upper and lower liquid crystal glass substrates are assembled together with a space as narrow as 2 µm to 9 µm between the substrates. This affects the performance and quality of the liquid crystal display panel. For example, the brightness of the liquid crystal display may be affected by the distance of the space. Therefore, it is important to assemble the liquid crystal glass substrates so that the substrates have an even thickness, and that pressure is exerted evenly over the entire substrates. However, because the adhesive tape or the like does not have even thickness, it is impossible to substantially evenly exert pressure over the entire substrates.

The present invention is made in light of the conventional problems, and an object of the present invention is to provide a method for holding a substrate in a vacuum, a method for manufacturing a liquid crystal display device, and a substrate holding device, whereby the adhesive agent is prevented from remaining on the substrate, and the adhesive sheet is detached from the substrate after the assembly.

Another object of the present invention is to provide a method for holding a substrate in a vacuum, a method for manufacturing a liquid crystal display device, and a substrate holding device, whereby pressure is evenly exerted over the entire substrate, and the substrate is assembled with the other substrate with an even space between each other.

DISCLOSURE OF INVENTION

To solve the problem, a method of the present invention for holding a substrate in a vacuum includes the step of: holding a substrate with an adhesive pad or adhesive sheet made from a material containing diene-based resin.

To solve the problem, a method of the present invention for manufacturing a liquid crystal display device, comprising the steps of: applying a sealing material for substrate anchorage to one of two substrates that are to be assembled together; dropping a liquid crystal to one of the two substrates; and assembling the two substrates in a vacuum, wherein: the two substrates are assembled together in a vacuum by holding an upper one of the substrates with an adhesive pad or adhesive sheet made from a material containing a diene-based resin.

To solve the problem, a substrate holding device of the present invention that holds a substrate in a vacuum, comprising: an adhesive pad or adhesive sheet, made from a material containing a diene-based resin, for holding the substrate.

According to the present invention, the adhesive pad and the adhesive sheet, both of which are made from a material containing diene-based resin, is used for holding the substrate. Because the diene-based resin has $CH_2$— at the both ends, suitable adhesion and detachability are obtained when holding the substrate in a vacuum.

Namely, unlike a double-face adhesive tape to which an adhesive agent is applied, no adhesive agent remains on the substrate, and adhesion is weak enough to allow the adhesive pad and the adhesive sheet to detach from the substrate.

The present invention therefore provides a method for holding a substrate in a vacuum, a method for manufacturing a liquid crystal display device, and the substrate assembly device, whereby an adhesive agent is prevented from remaining on the substrate, and the adhesive pad and the adhesive sheet can be detached with ease from the substrate after assembling the substrates.

Further, in manufacturing a liquid crystal display device in particular, an electrostatic chuck is not used to hold the substrate, thereby preventing a change in characteristic of the TFT (Thin Film Transistor) element caused by application of a high voltage while holding the substrate. Furthermore, because the adhesive pad and the adhesive sheet, both of which are made from a material containing diene-based resin, are used for holding the substrate, the substrate assembly device in a vacuum can be realized by a simple structure.

The method for holding a substrate in a vacuum is arranged so that the diene-based resin is made of unsaturated polybutadiene.

The method for manufacturing a liquid crystal display device is arranged so that the diene-based resin is made of unsaturated polybutadiene.

The substrate holding device of the present invention is arranged so that the diene-based resin is made of unsaturated polybutadiene.

According to the present invention, the diene-based resin is made of unsaturated polybutadiene.

In the diene-based resin, the unsaturated polybutadiene provides suitable adhesion and detachability in holding the glass substrate in a vacuum. The unsaturated polybutadiene is stable in a vacuum because it maintains its adhesion and does not generate any gas. Further, even when dust is attached, the adhesion can be restored when washed with water and dried.

The substrate holding device of the present invention further includes: a stage with a through hole which allows a pad of the adhesive pad to move freely therein, and with a flat face that faces the substrate.

According to the present invention, the stage includes the through hole allows the pad of the adhesive pad to move freely up and down therein.

On this account, the diameter of the through hole and the area of an adhesive face of the pad inserted through the through hole on the adhesive pad can be determined in accordance with the time necessary for holding the substrate in a vacuum.

When the pad of the adhesive pad protrude from the stage, it is impossible to evenly exert pressure over the substrate.

However, in the present invention, because the through hole of the stage allow the pad of the adhesive pad to freely move up and down therein, it is possible to prevent the pad of the adhesive pad from projecting out of the stage when the adhesive pad holds the substrate.

On this account, the substrate can be held by the adhesive pad in such manner that the substrate is entirely in contact with the flat face of the stage. This prevents the problem of unevenness in areas of the substrate brought into contact with the pad when pressure is applied on the substrate to be assembled.

The substrate holding device is arranged so that the through hole allows gas to jet therethrough toward a substrate held by the pad of the adhesive pad.

According to the present invention, the through hole can eject gas onto the substrate held by the pad of the adhesive pad. With the gas so ejected through the through hole onto the substrate, the substrate can be detached from the adhesive pad.

This enables the substrate to be detached with ease, and protects the substrate from being damaged when it is detached.

The method for holding a substrate in vacuum and the substrate holding device are arranged so that the adhesive pad or the adhesive sheet has an adhesive face with surface irregularities.

A method for manufacturing a liquid crystal display device includes the steps of: applying a sealing material for substrate anchorage to one of two substrates that are to be assembled together; dropping a liquid crystal to one of the two substrates; and assembling the two substrates in a vacuum, wherein: the two substrates are assembled together in a vacuum by holding one of or both of the substrates with an adhesive pad or adhesive sheet made from a material containing diene-based resin and having an adhesive face with surface irregularities.

According to the arrangement, the raised portions of the surface irregularities on the adhesive pad or adhesive sheet are in contact with the substrate(s), and the raised portions can suitably deform when assembling the substrates by exerting pressure from the both sides of the substrates held by the adhesive pad or adhesive sheet. This enables pressure to be exerted more evenly over the substrates as compared with using an adhesive pad or adhesive sheet whose adhesive face is flat without irregularities. As a result, the substrates are assembled together with an even space between each other.

Further, the adhesion that holds the substrates can be adjusted by the shape of irregularities. As a result, the adhesion that holds the substrate does not become too strong, and it does not cause large stress on the substrate when detaching the adhesive pad or adhesive sheet from the substrates.

The method for holding a substrate in vacuum, the method for manufacturing a liquid crystal display device, and the device for holding the substrate may be arranged so that the surface irregularities of the adhesive pad or the adhesive sheet have raised portions whose adhesive faces have fine raised portions finer than the raised portions.

According to the arrangement, the fine raised portions formed on the adhesive faces of the raised portion can be used to adjust the area of contact the substrate(s) (i.e., the adhesion of the raised portion). By adjusting the adhesion of the raised portions, the adhesive face of the convex section does not become too small, and accordingly the pressure the raised portions exert on the substrate does not become too strong locally. Further, with the adhesion of the raised portions adjusted, the rigidity of the raised portions does not become too weak.

The method for holding a substrate, the method for manufacturing a liquid crystal display device, and the device for holding the substrate are arranged so that the raised portions are arranged in the form of hexagons in a honeycomb pattern, so as to constitute at least part of sides of the hexagons.

The method for holding a substrate in vacuum may be arranged so that the raised portions are arranged to constitute the respective sides of the hexagons in a honeycomb pattern.

The method for holding a substrate in vacuum may be arranged so that the raised portions encompass apexes of the hexagons.

The method for holding a substrate in vacuum may be arranged so that the raised portions each extend in three directions from an apex of the hexagons in the honeycomb pattern, so as to constitute at least part of the sides of three hexagons adjacent to one another.

According to the arrangement, the raised portions can more easily be densely provided in the adhesive pad or adhesive sheet so as not to cause uneven cell thickness (unevenness in the thickness between the substrates) when the adhesive pad or adhesive sheet holds the substrate(s), and, for example, when the substrates thus held are assembled together by applying pressure from the both sides of the substrates. Also, as described above, in the position registration of the substrates during the assembly, the raised portions do not collapse easily and the position registration of the substrates is easier as compared with a layout in which the raised portions are simply disposed in one direction.

The substrate holding device may be adapted to hold a substrate in a vacuum. The substrate holding device that holds the substrate by the adhesion of the adhesive pad or adhesive sheet can suitably hold the substrate(s) even in a vacuum. Therefore, unlike an electrostatic chuck, the device is suitable for use in a vacuum without causing electrical damage to the substrate such as a liquid crystal substrate.

A substrate holding device of the present invention includes: an adhesive member for holding a substrate, the adhesive member having flexibility and adhesion, and being able to maintain its shape after a release of applied external pressure.

According to the arrangement, unlike the adhesive tape to which an adhesive agent is applied, the adhesive agent does not remain on the substrates, and adhesion is adequate to hold and release the substrate. Therefore, the device is suitable for holding the substrate.

Additional objects, features, and strengths of the present invention will be made clear by the description below. Further, the advantages of the present invention will be evident from the following explanation in reference to the drawings.

BRIEF DESCRIPTION OF DRAWINGS

FIG. 10(a) is a cross sectional view illustrating a state before the placement of substrates in a step of assembling the substrates together. FIG. 10(b) is a cross sectional view illustrating a state in which the upper substrate has been placed in a substrate assembly device. FIG. 10(c) is a cross sectional view illustrating a state in which the lower substrate has been placed in the substrate assembly device. FIG. 10(d) is a cross sectional view illustrating a state in which the substrates are being assembled together.

FIG. 17(a) is a cross sectional view illustrating a state before the placement of the substrate in a substrate assembly step in which the substrate assembly device shown in FIG. 13 is used. FIG. 17(b) is a cross sectional view illustrating a state in which the upper substrate has been placed in the substrate assembly device. FIG. 17(c) is a cross sectional view illustrating a state in which the lower substrate has been placed in the substrate assembly device.

FIG. 19(a) is a cross sectional view showing a state after the state shown in FIG. 18(c), in which the upper substrate holding device has been moved up. FIG. 19(b) is a cross sectional view illustrating a state in which the substrates have been brought out of the vacuum chamber.

BEST MODE FOR CARRYING OUT THE INVENTION

Hereinafter, detailed description of the present invention is made based on examples and comparative examples. It should be noted, however, that the present invention is not limited to the following description in any ways.

First Embodiment

The following description deals with First Embodiment of the present invention with reference to FIG. 1 through FIG. 12.

Figure 2:
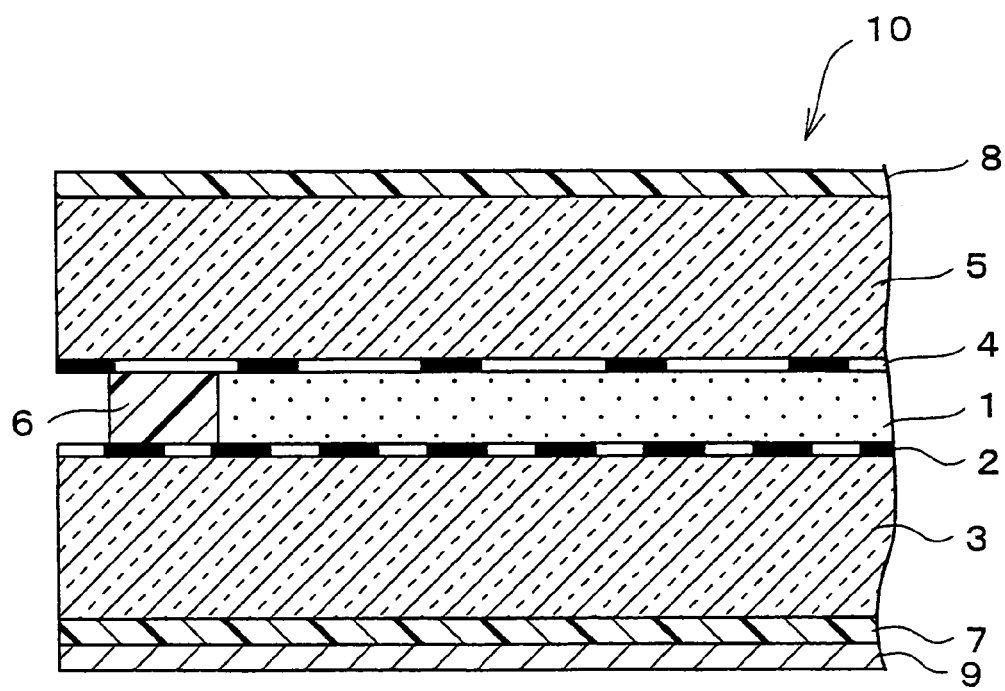
FIG. 2 is a cross sectional view illustrating an arrangement of a liquid crystal display device which is manufactured in accordance with a method for holding a substrate in a vacuum, and a method for manufacturing a liquid crystal display device.

As shown in FIG. 2, a liquid crystal display device of the present embodiment has a liquid crystal display panel 10 in which, for example, a glass substrate 3, provided with pixel electrodes 2 for individually driving a liquid crystal material 1 in a pixel area in response to applied electric field, is disposed opposite a glass substrate 5 having counter electrodes 4. The glass substrate 3 and the glass substrate 5 are assembled with each other with a sealing material 6 sealing the periphery of the glass substrates 3 and 5, with the liquid crystal material 1 of a certain thickness sandwiched therebetween. The liquid crystal display panel 10 further includes polarizing plates 7 and 8, and reflecting plates 9 made of aluminum and/or the like. Furthermore, the liquid crystal display panel 10 includes a retardation plate, a light diffusing plate, a color filter layer, and the like, all of which are not shown in the figure. Also, a driving element (not shown), such as a TFT (thin film transistor) element or the like, is provided on the glass substrate 3. The liquid crystal display panel 10 is connected to a driving circuit (not shown) or the like, thereby constructing a liquid crystal display device.

Note that the present invention is not just limited to the liquid crystal display device described herein, and an additional member may be added or an already existing member may be omitted as required by, for example, replacing the reflecting plate 9 in the liquid crystal display panel 10 with a back light unit and/or the like.

Figure 3:
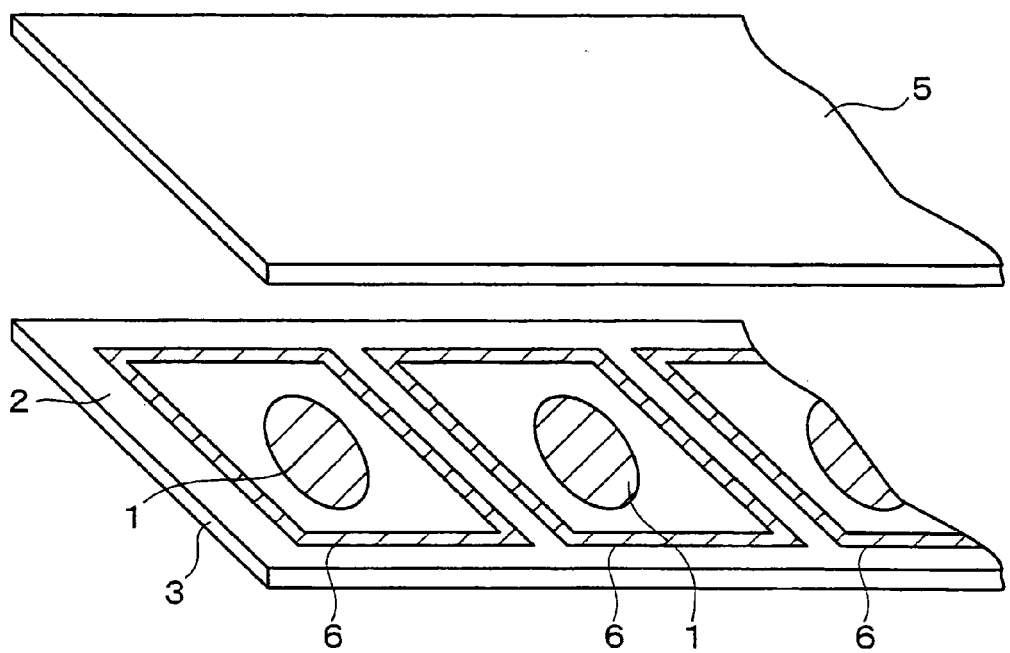
FIG. 3 is a perspective view illustrating a step of injecting a liquid crystal material into a liquid crystal panel of the liquid crystal display device.
Figure 4:
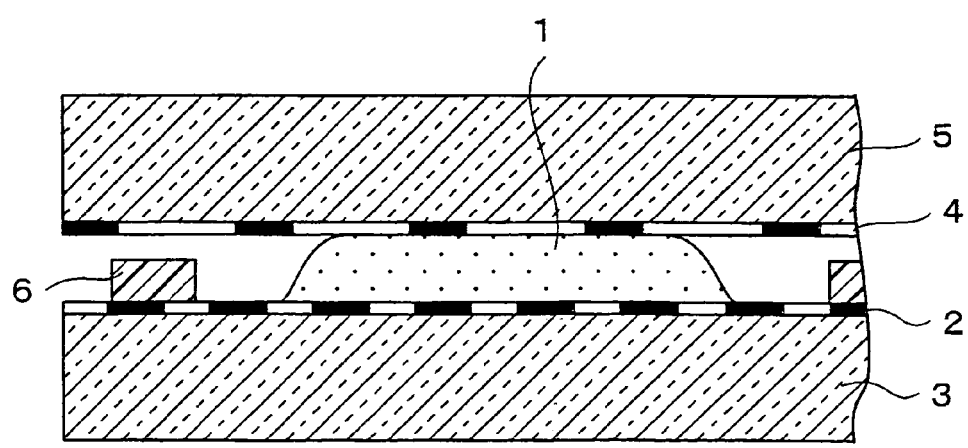
FIG. 4 is a cross sectional view illustrating the step of injecting the liquid crystal material into the liquid crystal panel of the liquid crystal display device.

As shown in FIG. 3, in order to form the liquid crystal panel 10, the sealing material 6 is applied on the periphery of the glass substrate 3, and the liquid crystal material 1 is dropped in areas surrounded by the seal member 6. Then, as shown in FIG. 4, pressure is applied on the glass substrate 3 from above, so as to assemble the glass substrates 3 and 5 with the liquid crystal material 1 filled and sealed between them as shown in FIG. 2. Note that the application of the sealing material 6, and dropping of the crystal material 1 may be carried out to either the glass substrate 3 or the glass substrate 5.

Figure 1:
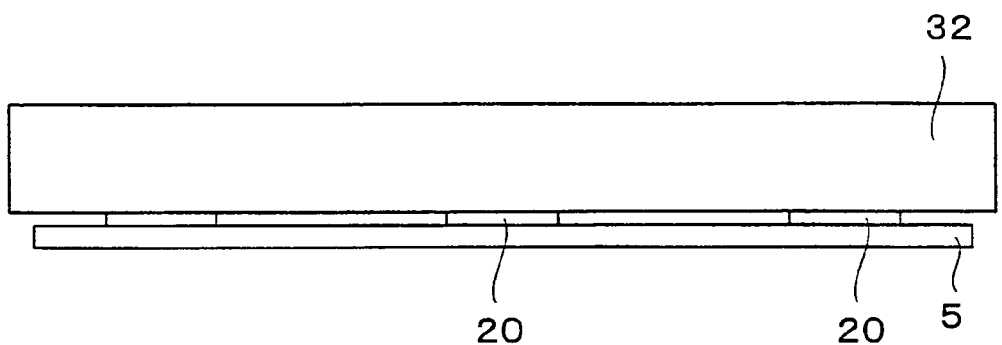
FIG. 1 is a front view illustrating a method for holding a substrate in a vacuum in one embodiment of the present invention.

Here, in the step of filling and sealing the liquid crystal material 1, air should not enter the liquid crystal material 1. Therefore, the step is performed in a vacuum device. However, in this case, how to hold the glass substrate 5 is brought into question. In the present embodiment, as shown in FIG. 1, a plurality of adhesive pads 20 are used to hold, for example, the glass substrate 5, which is an upper substrate.

Figure 5A:
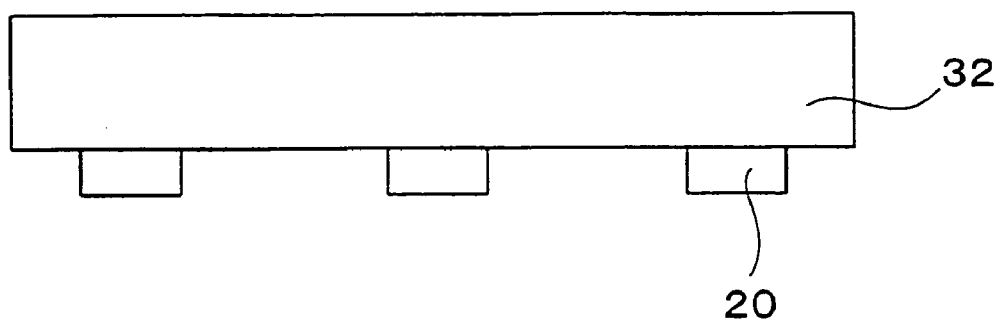
FIG. 5(a) is a front view illustrating adhesive pads provided on an upper stage.
Figure 5B:
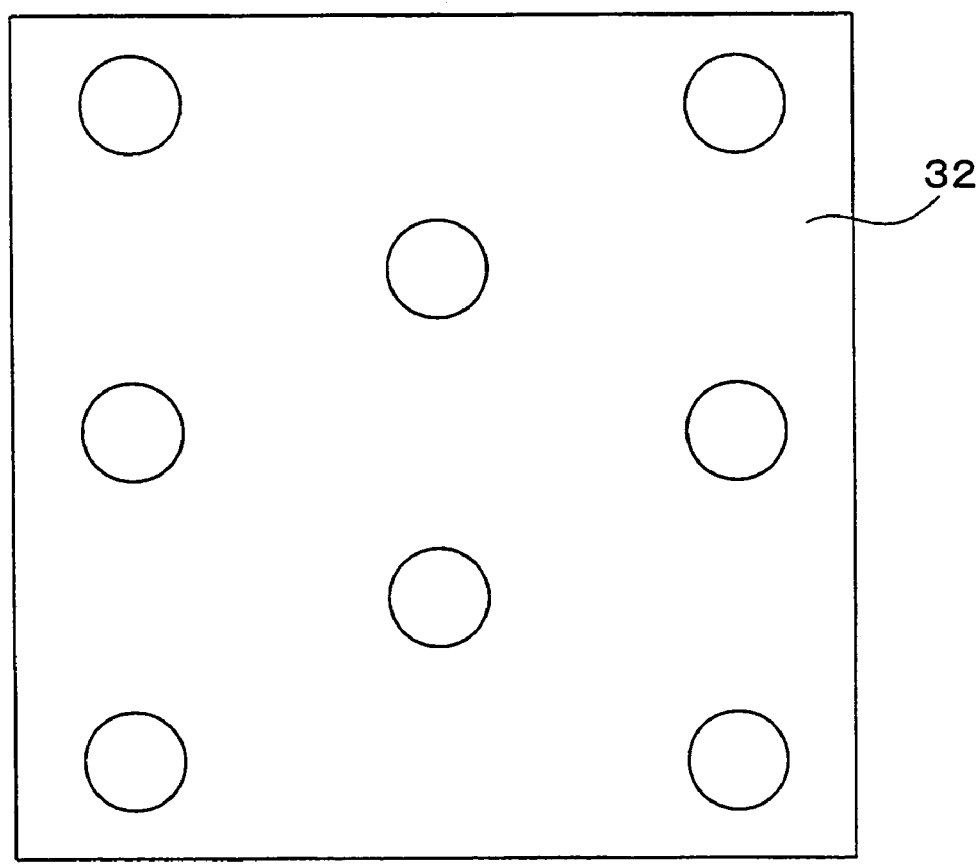
FIG. 5(b) is a bottom view illustrating the adhesive pads provided on the upper stage.

That is, as shown in FIGS. 5(a) and 5(b), the adhesive pads 20 are cylindrical in shape with a thickness of a few millimeter, and are rubbery and elastic. The adhesive pads 20 are bonded and fixed in portions of an upper stage 32. Note that the total area of the adhesive pads 20 stuck to the upper stage 32 is so determined as to hold the glass substrate 5 longer than a time necessary for bonding in a vacuum.

Figure 6A:
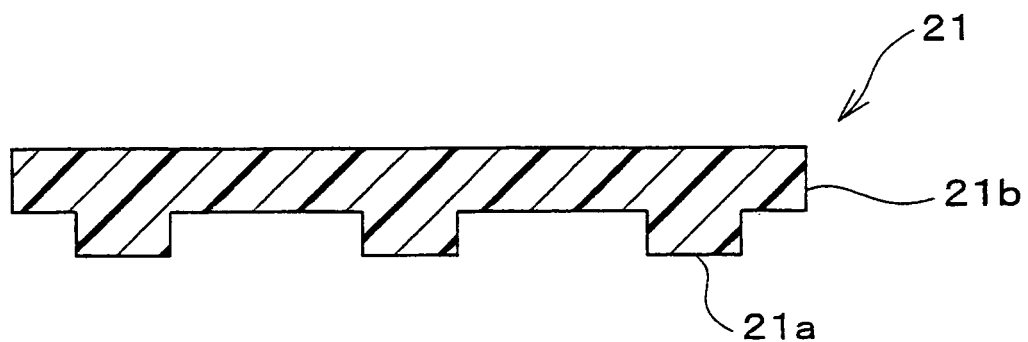
FIG. 6(a) is a cross sectional view illustrating another type of adhesive pads.
Figure 6B:
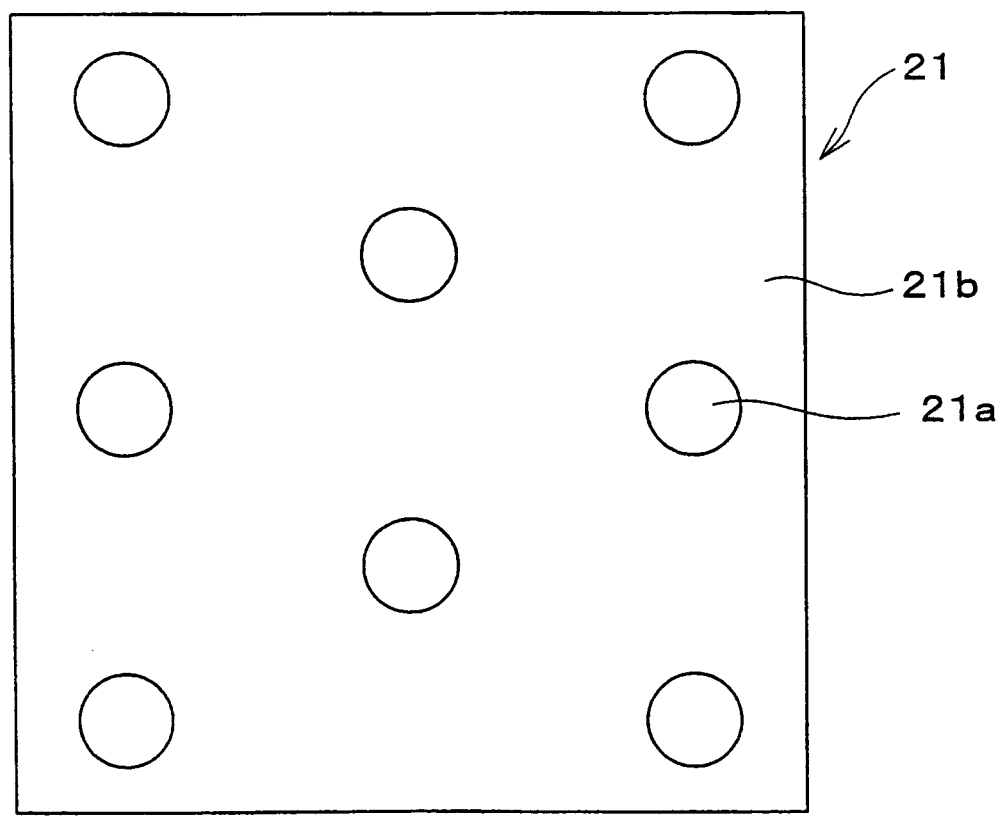
FIG. 6(b) is a bottom view of the adhesive pads.

Here, the adhesive pads 20 are not limited to the form described in this embodiment. For example, as shown in FIGS. 6(a) and 6(b), an adhesive pad 21 may be formed that includes a flat plate portion 21b and a plurality of pads 21a in one piece, with the pads 21a cylindrically protruding from portions on a surface of the flat plate portion 21b. Note that, the adhesive pad 21 may be made of soft material. In this case, the thickness of the flat plate portion 21b is increased, or the adhesive pad 21 is bonded and fixed on the upper stage 32 or a hard flat plate, for example.

Figure 7A:
FIG. 7(a) is a front view of an adhesive sheet.
Figure 7B:
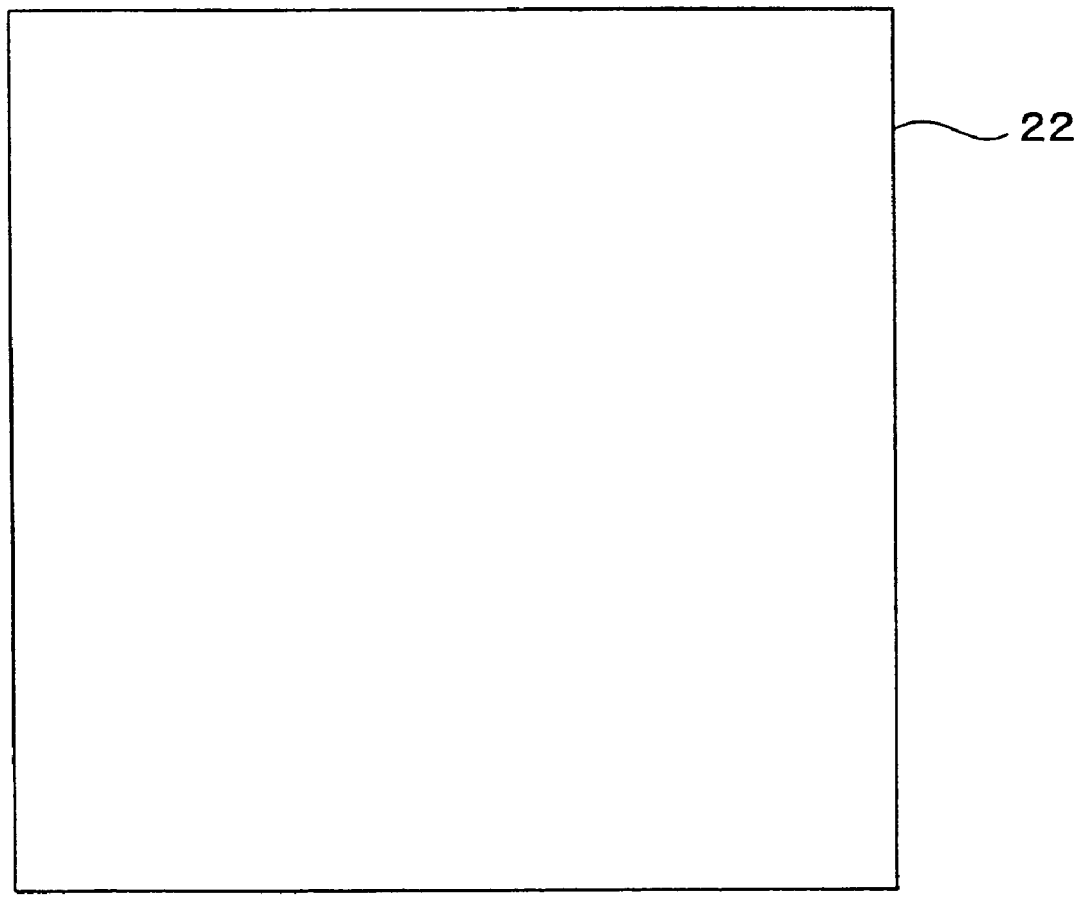
FIG. 7(b) is a bottom view of the adhesive sheet.

Note also that, other than the cylindrical pads like the adhesive pads 20 or 21, an adhesive sheet 22 may be provided for example (shown in FIGS. 7(a) and 7(b)). The adhesive sheet 22 may also be made of soft material. In this case, the thickness of the adhesive sheet 22 is increased, or the adhesive sheet 22 is bonded and fixed on the upper stage 32 or a hard flat plate, for example.

Figure 8:
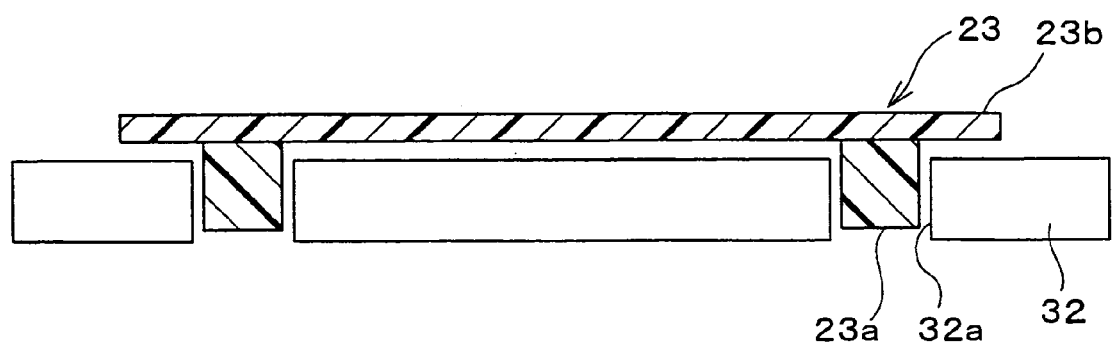
FIG. 8 is a cross sectional view illustrating still another type of adhesive pads.

Further, as shown in FIG. 8, an adhesive pad 23 may be provided in which cylindrical pads 23a thicker than the upper stage 32 are fixed on a hard substrate 23b, in such a manner that the cylindrical pads 23a can freely move in and out of through holes 32a provided in the upper stage 32. This ensures that the glass substrate 5 can be detached with ease from the adhesive pad 23 when the glass substrate 5 is held by the adhesive pad 23 as shown in FIGS. 9(a), 9(b) and 9(c).

Figure 9A:
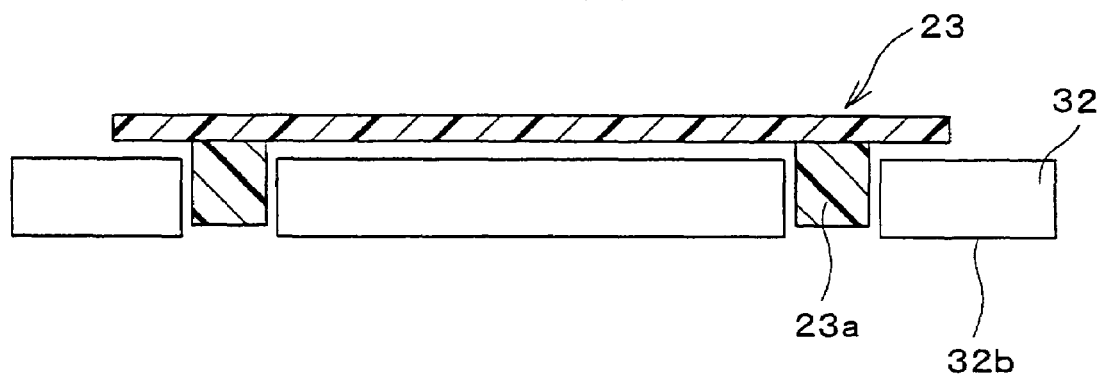
FIG. 9(a) through FIG. 9(c) are cross sectional views illustrating steps of adhering to and holding the substrate.
Figure 9B:
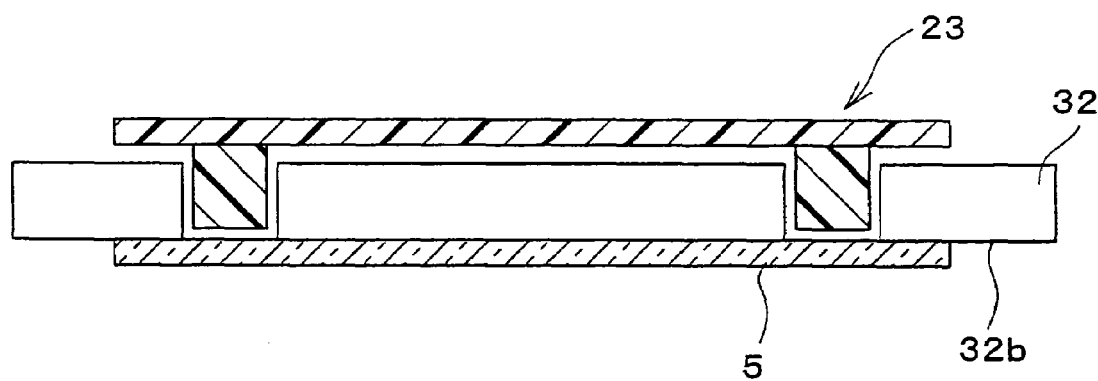
Figure 9C:
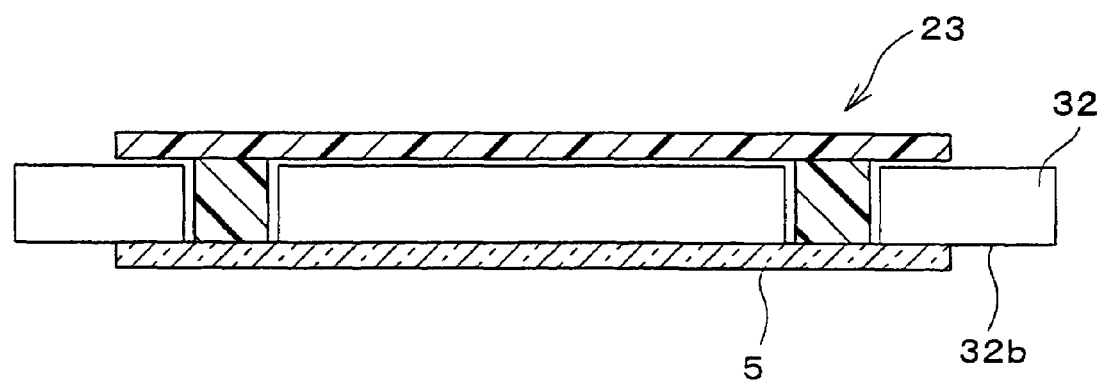

Namely, as shown in FIG. 9(a), in a vacuum chamber, the lower end face of the pads 23a of the adhesive pad 23 is initially above a flat lower face 32b of the upper stage 32. In this state, the glass substrate 5 is disposed beneath the upper stage 32 and a vacuum suction is carried out to draw the glass substrate 5 onto the lower face 32b, as shown in FIG. 9(b). Thereafter, as shown in FIG. 9(c), the adhesive pad 23 is moved down so as to bring the lower end face of the pads 23a into contact with the glass substrate 5, thereby holding the glass substrate 5 with the adhesive pad 23. Note that it is preferable that the adhesive pad 23 is moved down to such an extent that the glass substrate 5 remains in contact with the lower face 32b of the upper stage 32. This is for keeping the glass substrate 5 at a horizontal level.

The adhesive pad 23 keeps holding the glass substrate 5 even after the vacuum chamber is brought back to atmospheric pressure, so that the glass substrate 5 does not fall from the adhesive pad 20.

The glass substrate 5 can be detached from the adhesive pad 23 with ease by lifting up the adhesive pad 23 with the upper stage 32 remains fixed.

The following description deals with a material of the adhesive pads 20, 21, 23, and of the adhesive sheet 22 according to the present embodiment.

The adhesive pads 20, 21, and 23 and the adhesive sheet 22 are made from a material including diene based resin. Specifically, they are made of unsaturated polybutadiene, which is a diene-based resin.

Before hardened, the unsaturated polybutadiene, which is a diene-based resin having two unsaturated double bonds, has the chemical formula:

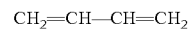

When hardened, the chemical formula changes to:

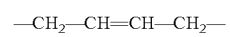

The $CH_2$— at the both ends of the chemical formula are assumed to render adhesion to the adhesive pads 20, 21, 23, and the adhesive sheet 22. The adhesion is intact in a vacuum, but it is lost when moisture or dust is attached to the surface of the adhesive pads 20, 21, 23, or the adhesive sheet 22. However, even when the dust is attached, the adhesion can be restored by water-washing and drying the adhesive pads 20, 21, 23, and the adhesive sheet 22. Note that the adhesion is, for example, 100 g/cm$^2$ or greater.

When the adhesive pads 20, 21, 23, and the adhesive sheet 22, all of which are made of unsaturated polybutadiene, are A3 size or smaller, they may have a thickness of, for example, about 0.3 mm to 5 mm. When the adhesive pads 20, 21, 23, and the adhesive sheet 22 are bigger than A3 size and are not bigger than 730 mm×920 mm, they may have a thickness of, for example, about 1 mm to 5 mm.

The following description deals with a method for manufacturing the liquid crystal panel 10 of the liquid display device with a substrate assembly device using the adhesive pad 23.

As shown in FIG. 10(a), in a vacuum chamber 31, a substrate assembly device 30 serving as a substrate holding device includes the upper stage 32 and the adhesive pad 23 made of unsaturated polybutadiene. The upper stage 32 presses the glass substrate 5 disposed above the glass substrate 3. The adhesive pad 23 is provided so as to be movable in and out of the through holes 32a of the upper stage 32. Beneath the substrate assembly device 30, a lower stage 33 is provided for mounting the glass substrate 3. The upper stage 32 can move up and down, and the adhesive pad 23 also can move up and down separately from the upper stage 32.

Note that a vacuum pipe and the like for vacuuming the vacuum chamber 31 are omitted in the figure.

Note also that, next to the substrate assembly device 30 in the vacuum chamber 31, the glass substrate 3 including the pixel electrodes 2 (not shown) and the glass substrate 5 including the counter electrodes 4 (not shown) are set in position. Around the periphery of the glass substrate 3, the sealing material 6 has been applied, and the liquid crystal material 1 has been dropped on the center of the glass substrate 3 surrounded by the sealing material 6. Note that, the sealing material 6 is not necessarily required to be applied to the glass substrate 3 as in the figure, and the sealing material 6 may be applied to the glass substrate 5 as well.

In this state, the glass substrate 5 is placed beneath the upper stage 32, and is brought into contact with the upper stage 32, as shown in FIG. 10(b), by carrying out a vacuum suction. Then, the adhesive pad 23 is moved down so as to make contact with the glass substrate 5, thereby holding the glass substrate 5 with the adhesive pad 23.

Here, the adhesive pad 23 made of unsaturated polybutadiene has adhesion, and the adhesion is maintained even in a vacuum. Further, the adhesive pad 23 is stable in a vacuum without generating any gas. Therefore, no problem is posed even when the adhesive pad 23 is exposed in the vacuum when the glass substrates 5 and 3 are assembled together. Furthermore, because the adhesive pad 23 holds the glass substrate 5, the glass substrate 5 does not fall even after the vacuum suction is released.

In the case where the pads 23a of the adhesive pad 23 protrude from the upper stage 32, it is impossible to evenly exert pressure on the glass substrate 5 during assembly. In this case, assembling the glass substrates 3 and 5 causes an uneven cell thickness in areas of the glass substrate 5 in contact with the pads 23a. In order to prevent this, any protrusion of the pads 23a from the upper stage 32 should be minimized.

Next, as shown in FIG. 10(c), the glass substrate 3 is moved and placed on the lower stage 33. Then, the vacuum chamber 31 is further evacuated to a predetermined degree of vacuum. Note that, in the figure, the lower glass substrate 3 is brought into the substrate assembly device 30 after the upper glass substrate 5, but the order of bringing in the glass substrates 3 and 5 is not necessarily limited to this, and the glass substrate 3 may be brought into the substrate assembly device 30 before the glass substrate 5.

Thereafter, as shown in FIG. 10(d), the adhesive pad 23 and the upper stage 32 are moved down together so as to assembly the glass substrate 5 and the glass substrate 3 together with position registration. Because the adhesive pad 23 holds the glass substrate 5, misregistration does not occur. Note that the adhesive pad 23 may also be used for holding the glass substrate 3. Alternatively, the glass substrate 3 may be mechanically held so as to avoid misregistration.

Figure 11A:
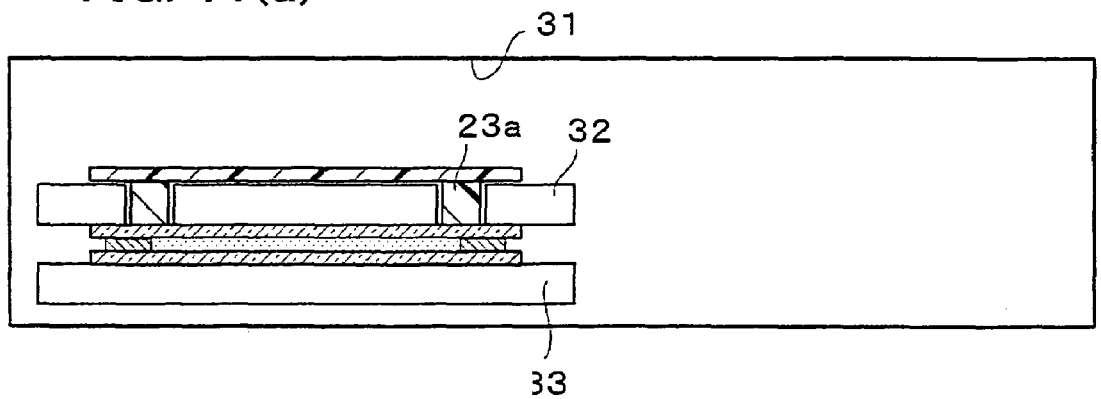
FIG. 11(a) is a cross sectional view illustrating a state at the completion of pressing the substrates in the substrate assembly step.

Then, as shown in FIG. 11(a), the glass substrate 5 and the glass substrate 3 are pressed against each other until a certain space is obtained therebetween.

Figure 11B:
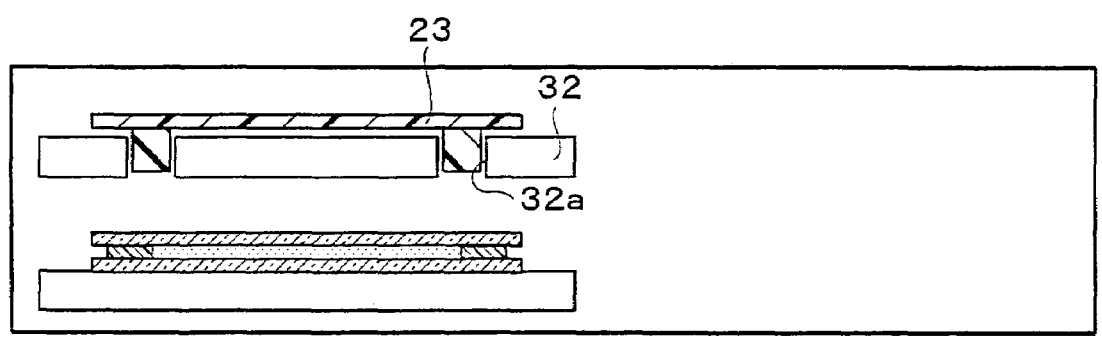
FIG. 11(b) is a cross sectional view illustrating a state in which the upper stage is moved upward after detaching the adhesive pads.

After that, as shown in FIG. 11(b), the adhesive pad 23 is firstly moved up with the upper stage 32 fixed, thereby releasing the adhesion between the adhesive pad 23 and the glass substrate 5. Then, the upper stage 32 is moved up. Note that it is also possible to detach the adhesive pad 23 from the glass substrate 5 or 3, for example, by a back blow, by flowing nitrogen gas or dry air into an opening for vacuum suction, i.e., an opening between the upper stage 32 and the pad 23a in the through hole 32a, after the applied pressure has been released. In this case, in the vacuum chamber 31, the adhesive pad 23 can be detached more easily in a vacuum than under atmospheric pressure.

Figure 11C:
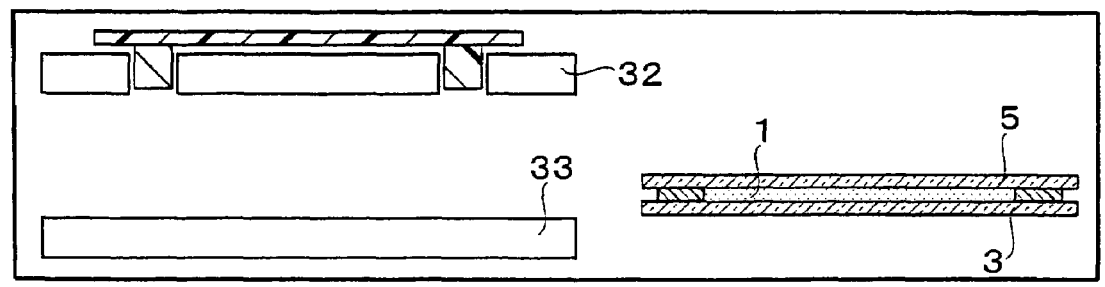
FIG. 11(c) is a cross sectional view illustrating a state in which the assembled substrates have been brought out of the substrate assembly device.

Next, after inside of the vacuum chamber 31 is returned to atmospheric pressure, the glass substrates 3 and 5 which are assembled together are brought out from the vacuum chamber 31, as shown in FIG. 11(c). Then, irradiation of ultraviolet light and heat sinter are carried out to the glass substrates 3 and 5 so as to completely harden the sealing material 6.

Thereafter, the polarizing plates 7 and 8, and the reflecting plate 9 made of aluminum and/or the like are attached to the glass substrates 3 and 5, thereby fabricating the liquid crystal display panel 10. Then, the liquid crystal display panel 10 is connected to a driving circuit (not shown) and the like, thereby obtaining the product liquid crystal display device.

As described above, in the present embodiment, the adhesive pads 20, 21, 23, and the adhesive sheet 22, all of which are made from a material including diene-based resin, are used for: the method for holding a substrate; the method for manufacturing a liquid crystal display device; and the substrate assembly device 30. Because the diene-based resin has $CH_2$— at the both ends, suitable adhesion and detachability are obtained when holding the glass substrate 5 in a vacuum.

Namely, unlike a double-face adhesive tape to which an adhesive agent is applied, no adhesive agent remains on the glass substrate 5, and adhesion is weak enough to allow the adhesive pads 20, 21, 23, and the adhesive sheet 22 to detach from the glass substrate 5.

The present invention therefore provides a method for holding a substrate in a vacuum, a method for manufacturing a liquid crystal display device, and the substrate assembly device 30, whereby an adhesive agent is prevented from remaining on the glass substrate 5, and the adhesive pads 20, 21, 23, and the adhesive sheet 22 can be detached with ease from the glass substrate 5 after assembling the glass substrate 5 and 3.

Further, in manufacturing a liquid crystal display device in particular, the present embodiment does not use an electrostatic chuck to hold the glass substrates 5 and 3, and therefore prevents a change in characteristic of the TFT (Thin Film Transistor) element caused by application of a high voltage while holding the glass substrate 3. Furthermore, because the adhesive pads 20, 21, 23, and the adhesive sheet 22, all of which are made from a material including diene-based resin, are used for holding the glass substrate 5, the substrate assembly device 30 in a vacuum can be realized by a simple structure.

In the present embodiment, in the method for holding a substrate in a vacuum, the method for manufacturing a liquid crystal display device, and the substrate assembly device 30, the diene-based resin is made of unsaturated polybutadiene.

Among diene-based resins, the unsaturated polybutadiene provides suitable adhesion and detachability in holding the glass substrate 5 in a vacuum. The unsaturated polybutadiene is stable in a vacuum because it maintains its adhesion and does not generate any gas. Further, even when dust is attached, the adhesion can be restored when washed with water and dried. Furthermore, the unsaturated polybutadiene is highly durable against chemicals such as a solvent.

In the substrate assembly device 30, the upper stage 32 has the through holes 32a, which allow the pads 23a of the adhesive pad 23 to freely move up and down therein.

On this account, the diameter of the through holes 32a and the area of an adhesive face of the pads 23a inserted through the through holes 32a on the adhesive pad 23 can be determined in accordance with the time necessary for holding the glass substrate 5 in a vacuum.

When the pads 23a of the adhesive pad 23 protrude from the upper stage 32, it is impossible to evenly exert pressure over the glass substrate 5.

However, in the present embodiment, because the through holes 32a of the upper stage 32 allow the pads 23a of the adhesive pad 23 to freely move up and down therein, it is possible to prevent the pads 23a of the adhesive pad 23 from projecting out of the upper stage 32 when the adhesive pad 23 holds the glass substrate 5.

On this account, the glass substrate 5 can be held by the adhesive pad 23 in such manner that the glass substrate 5 is entirely in contact with the flat face of the upper stage 32. This prevents the problem of unevenness in areas of the glass substrate 5 brought into contact with the pads 23 when pressure is applied on the glass substrate 5 to be assembled with the glass substrate 3.

In the substrate holding device 30 of the present embodiment, the through holes 32a can eject gas onto the glass substrate 5 held by the pads 23a of the adhesive pad 23. With the gas so ejected through the through holes 32a onto the substrate 5, the glass substrate 5 can be detached from the adhesive pad 23.

This enables the glass substrate 5 to be detached with ease, and protects the glass substrate 5 from being damaged when it is detached.

Figure 12:
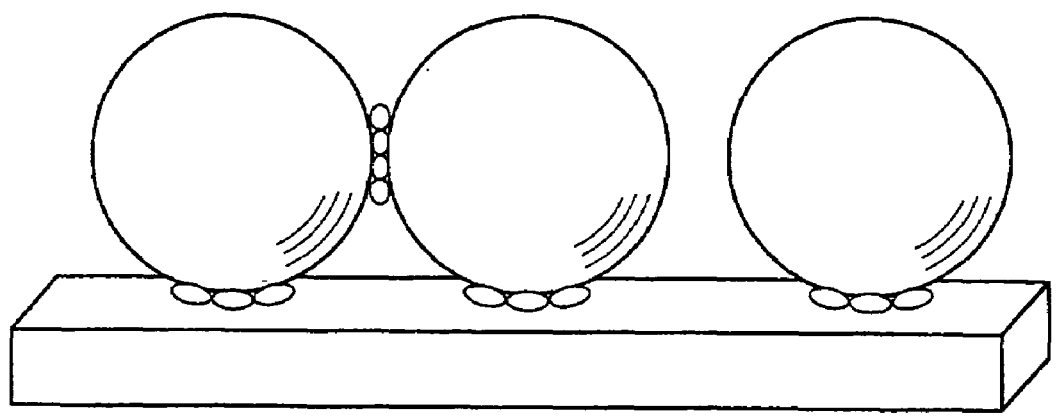
FIG. 12 is a perspective view illustrating an arrangement of silicon balls.

Note that, the glass substrates 5 and 3 as described in the present embodiment are used for manufacturing the liquid crystal panel 10; however, they are not necessarily limited to this and may be used as plasma display panel (PDP) substrates, EL (Electro Luminescence) substrates, plasma address (PALC) substrates, FED (Field Emission Display) substrates, silicon balls, or the like. The silicon balls are structured to include balls of silicon attached on a print substrate as shown in FIG. 12, wherein the balls of silicon are connected to one another or to the print substrate via electrodes provided on the surface of each ball of silicon. Silicon balls with a variety of functions such as a memory function or processor function may be three-dimensionally connected to one another to construct a system LSI.

EXAMPLE 1

An experiment was carried out to examine the effectiveness of adhesion of the adhesive pad 21 made of unsaturated polybutadiene described in the First Embodiment.

Firstly, an unsaturated polybutadiene resin (trade name "APR K-11") of the Asahi Kasei Corporation was used as a material of the adhesive pad 21. Note that the APR is a registered trademark. Generally, this unsaturated polybutadiene is used as a material for a relief in relief printing.

Then, a negative film, a cover film, the unsaturated polybutadiene resin, and a base film were set in this order on a glass plate of an exposure device, and an upper glass plate was used to apply pressure thereon.

Next, after forming a back separation layer by back exposure, a relief exposure was carried out to form a sharp relief section (pad section). Then, a portion of the resin which had not been hardened was washed by a washer liquid.

After that, the unsaturated polybutadiene resin was dried by hot air. Then, as required, a post exposure is carried out so as to securely harden a thin part of the unsaturated polybutadiene resin.

The adhesive pad 20 was thus obtained. The adhesive pad 20 showed a satisfactory holding performance when it was used to hold the glass substrate 5 in a vacuum device. Also, detachability of the adhesive pad 20 after holding the glass substrate 5 was found to be satisfactory.

It was also found that the adhesion of the adhesive pad 20 did not drop in a vacuum, and that the adhesive pad 20 was stable without generating any gas or the like. Furthermore, it was confirmed that even when dust is attached to the adhesive pad 20, the adhesion of the adhesive pad 20 was restored when the adhesive pad 20 was washed with water and dried. Also, the glass substrate 5 did not fall even after a vacuum suction was released.

Note that, as a comparative example, a double-sided adhesive tape and an adhesive label, both of which used an acrylic resin based adhesive agent, were examined. It was found as a result that the problem of detachability was caused after holding the glass substrate 5, and that the adhesive agent possibly remained on the glass substrate 5. Evaluation was also made for unsaturated polyester, and a mixture of polyester and urethane, which showed that their adhesion was insufficient.

Second Embodiment

The following description deals with another embodiment of the present invention with reference to FIG. 13 through FIG. 20.

In the present embodiment, as shown in FIG. 3, in order to manufacture a liquid crystal display panel 10 (see FIG. 2), a sealing material 6 is applied to the periphery of a glass substrate 3, and a liquid crystal material 1 is dropped in areas surrounded by the sealing material 6 on the glass substrate 3. After that, pressure is applied to at least one of the glass substrates 3 and 5 thereby assembling the glass substrates 3 and 5 with the liquid material 1 filled and sealed between them as shown in FIG. 2. Note that the application of the sealing material 6 and dropping of the liquid crystal material 1 may be carried out to either the glass substrate 3 or the glass substrate 5.

Figure 13:
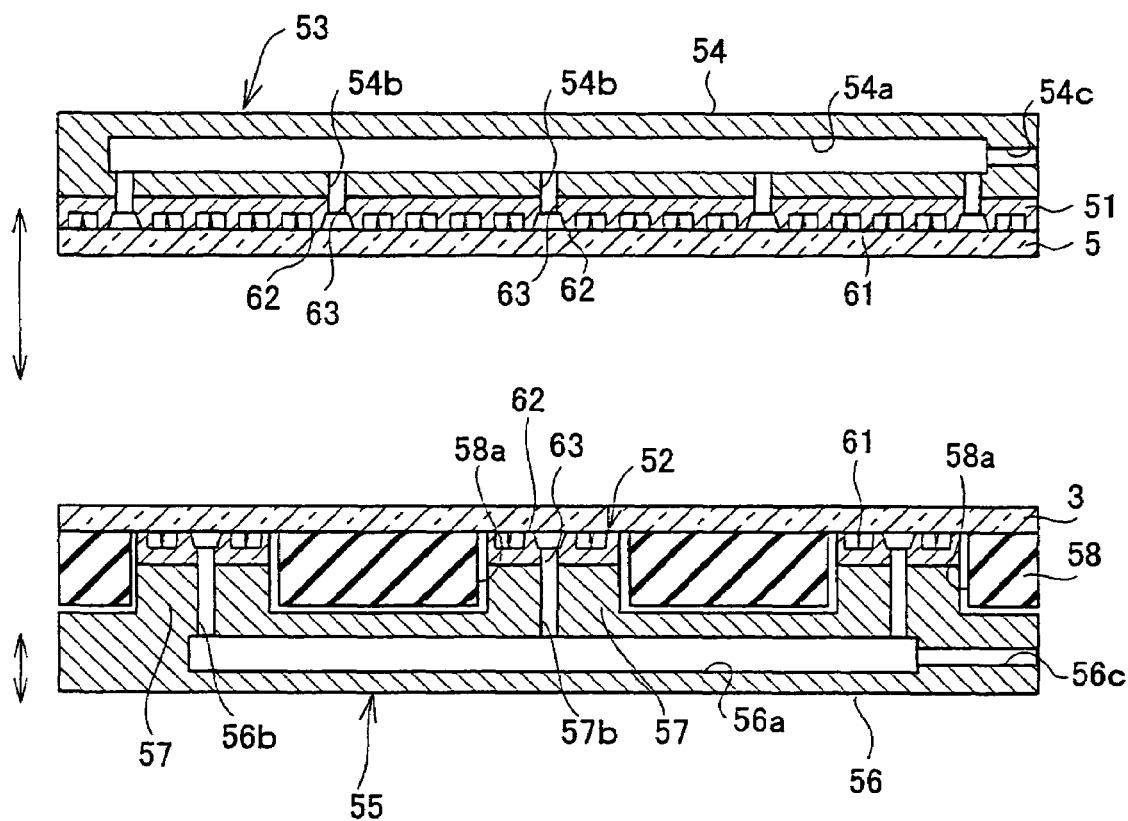
FIG. 13 is a longitudinal sectional view illustrating a substrate assembly device of another embodiment of the present invention.
Figure 14:
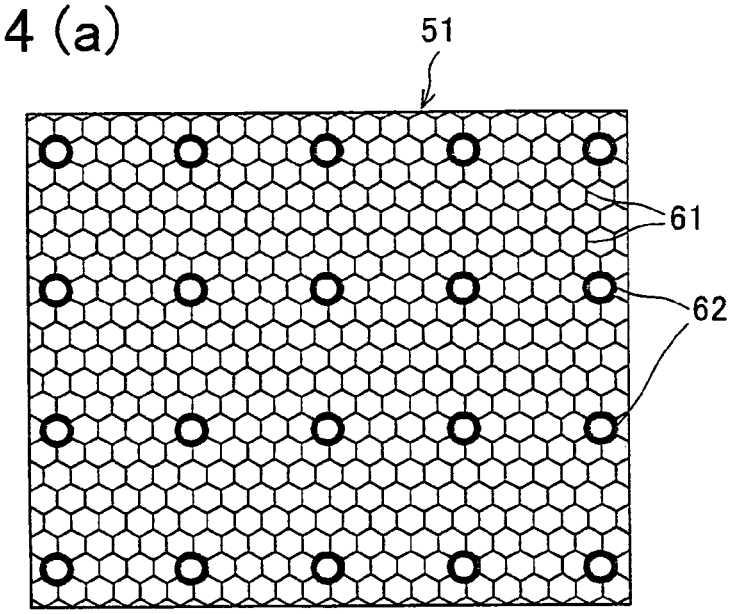
FIG. 14(a) is a plan view illustrating an adhesive sheet provided in an upper substrate holding device of the substrate assembly device shown in FIG. 13.
FIG. 14(b) is an enlarged view of FIG. 14(a).
FIG. 14(c) is a cross sectional view taken along the line X-X in FIG. 14(b).
Figure 14:
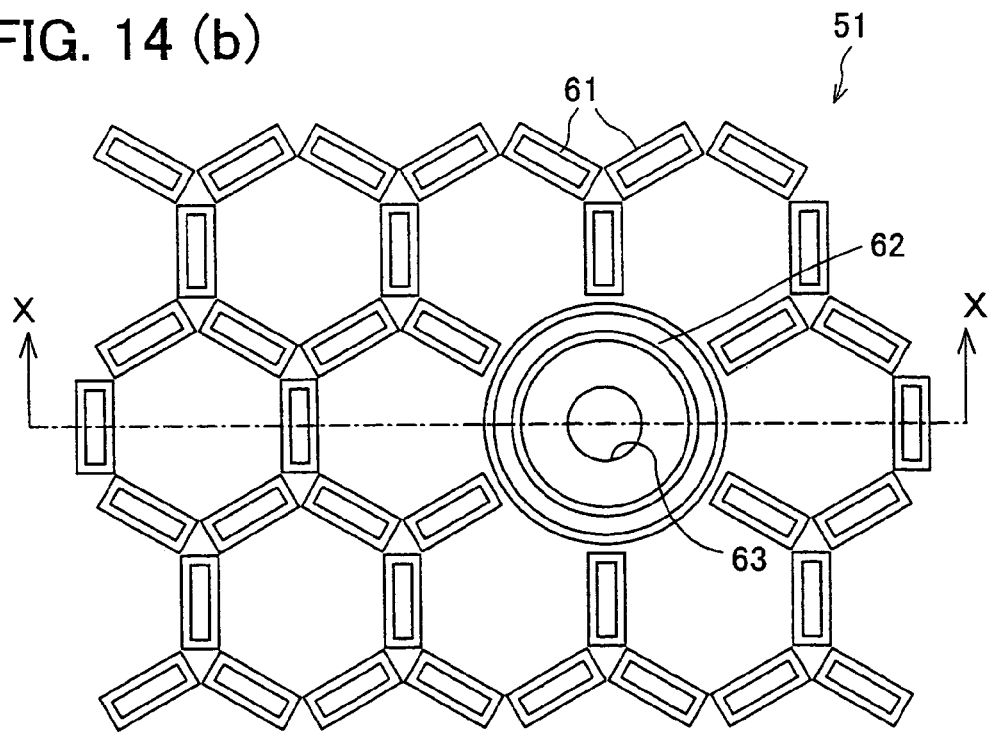
Figure 14:
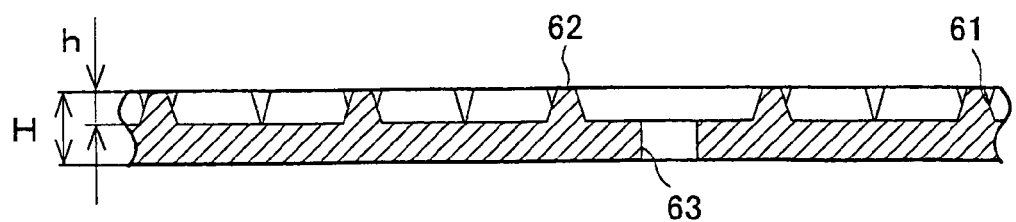
Figure 15:
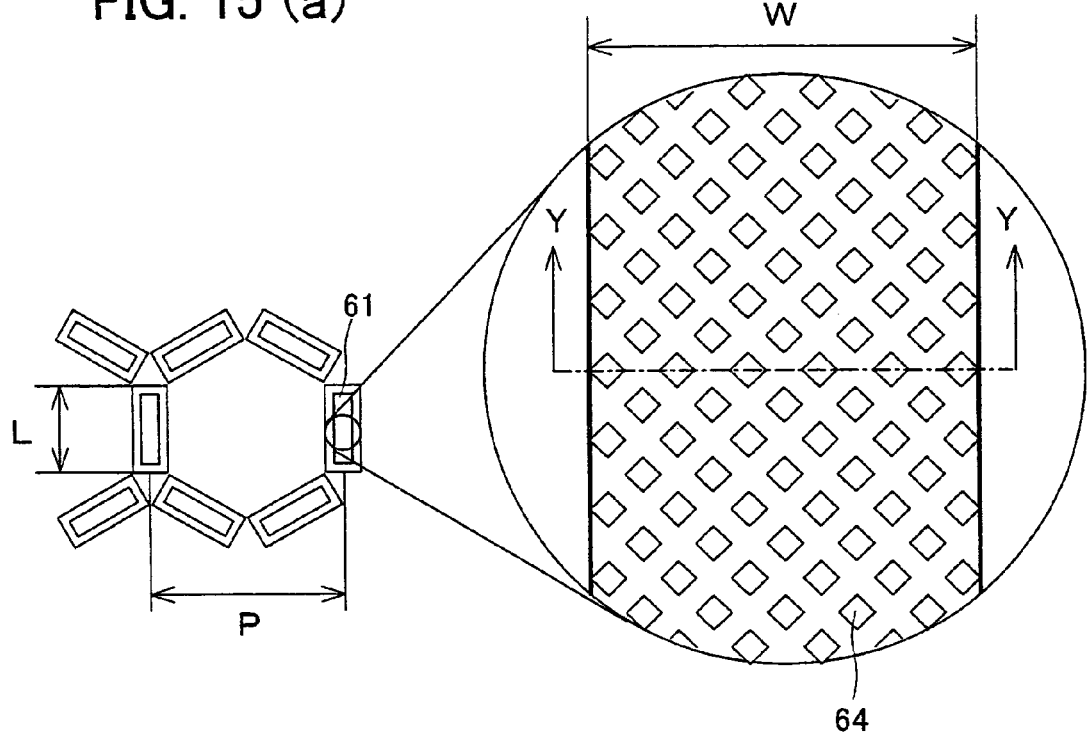
FIG. 15(a) is an enlarged view illustrating an adhesive face of a convex section shown in FIG. 14(b).
FIG. 15(b) is a cross sectional view taken along the line Y-Y in FIG. 15(a).
Figure 15:
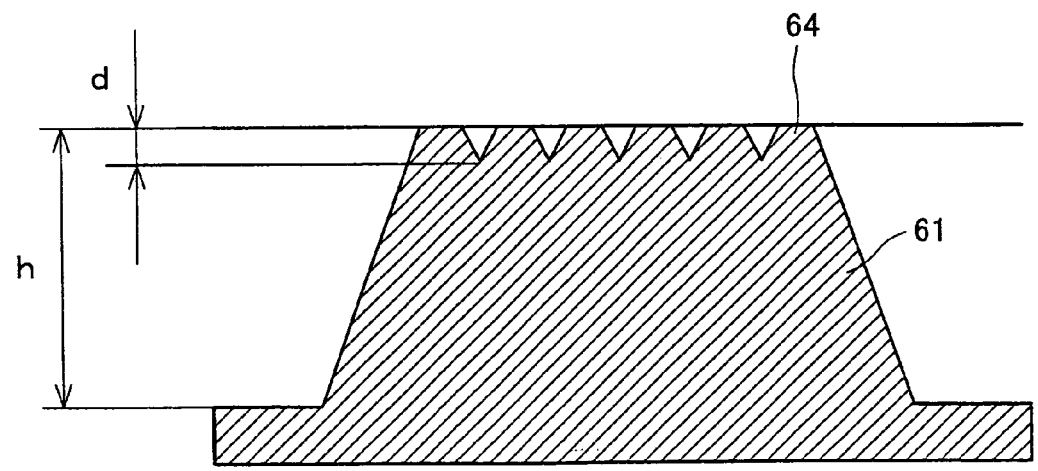

Here, as described above, in the step of filling and sealing the liquid crystal material 1, air should not enter the liquid crystal material 1. Therefore, the step of filling and sealing the liquid crystal material 1 is performed in a vacuum device. In this case, how to hold the glass substrates 3 and 5 together is brought into question. In the present embodiment, as shown in FIG. 13, an adhesive sheet 51 is used to hold, for example, the glass substrate 5, which is an upper substrate, and an adhesive pad 52 is used to hold, for example, the glass substrate 3, which is a lower substrate. Note that FIG. 13 is a longitudinal sectional view illustrating a substrate assembly device of the present embodiment.

The adhesive sheet 51 is provided on a lower face of a holding base section 54 of an upper substrate holding device 53. Inside the holding substrate section 54 is a space 54a. The holding base section 54 also includes a plurality of through holes 54b which connect the space 54a and the lower face of the holding base section 54. The holding substrate section 54 further includes an evacuation hole 54c which connects the space 54a and a side face of the holding substrate section 54.

The adhesive pad 52 is provided on an upper face of a cylindrical raised section 57 provided in a holding base section 56 of a lower substrate holding device 57. Inside the holding substrate section 56 is a space 56a. The holding base section 56 also includes a plurality of through holes 56b which connect the space 56a and the upper face of the holding base section 56. The holding substrate section 56 further includes an evacuation hole 56c which connects the space 56a and a side face of the holding substrate section 56.

The raised section 57 and the adhesive pad 52 of the holding substrate section 56 are provided in an cylindrical opening 58a provided through a lower stage 58, which is a plane flat plate. With the vertical movement of the holding substrate section 56, the raised section 57 and the adhesive pad 52 move in and out of the opening 58a.

As shown in FIG. 14(a), which is a plan view illustrating the adhesive sheet 51, a multiplicity of convex sections 61 are formed over the entire lower face (adhesive face) of the adhesive sheet 51. Among the cluster of the convex sections 61, suctioning pad sections 62 are formed that are interspersed at substantially regular intervals As shown in FIG. 14(b), which is an enlarged view of FIG. 14(a), the raised sections 61 are provided in a honeycomb pattern. Specifically, each of the raised sections 61 is disposed so as to form a side of a hexagon. The walls of each hexagon made by the raised sections 61 does not form a closed ring, but the rings are open with spaces between the raised portions 61.

Each of the suctioning pad sections 62 has, for example, a circular ring shape, and has a protruding wall that forms a closed ring. In a central portion of each suctioning pad section 62, a through hole 63 is formed that extends through the adhesive sheet 51 in a thickness direction. The through hole 63 communicates with the through hole 54b of the holding substrate section 54.

The adhesive sheet 51 has a longitudinal section as shown in FIG. 14(c), which is a cross sectional view taken along the line X-X in FIG. 14(b). As shown in the figure, the adhesive sheet 51 has a total thickness H of a few millimeters. Each of the convex sections 61 has a height in a range of about 100 μm to about 1 mm, or more preferably about 300 μm to 500 μm. The adhesive sheet 51 is rubbery and elastic.

Further, as shown in FIGS. 15(a) and 15(b), on an adhesive face of the convex section 61 of the adhesive sheet 51, fine raised portions 64 are formed. Note that FIG. 15(a) is an enlarged view illustrating the adhesive face of the convex section 61, and FIG. 15(b) is a cross sectional view taken along the line Y-Y in FIG. 15(a). The fine raised portions 64 has a depth d preferably in a range of from 10 μm to 100 μm, or more preferably from 20 μm to 40 μm. Note that, in the case where the fine convex sections 64 are not formed, the adhesive face of the convex section 61 naturally has irregularities having a height of a few micrometers.

The shapes (layout) and pitches of the raised sections 61 and the fine raised portions are determined so as to obtain (i) adhesion necessary to hold the substrate, such as the glass substrate 5, in a vacuum, (ii) a pitch which does not cause uneven cell thickness in the glass substrates 5 and 3 when they are assembled together, and (iii) desirable detachability from the glass substrate 5 after the assembly.

The convex sections 61 are arranged in a hexagonal pattern for the following reasons. The first reason is to densely dispose the convex sections 61 so as to avoid uneven cell thickness caused by the irregular pattern of the adhesive sheet 51 when the upper glass substrate 5 and the lower glass substrate 3 are assembled together. The second reason is to allow for easy alignment (position registration) of the glass substrates 5 and 3 when the glass substrates 5 and 3 are assembled together.

Namely, when the upper glass substrate 5 and the lower substrate 3 are assembled together, they are horizontally aligned with the liquid crystal material 1 and the sealing material 11 interposed therebetween. On this occasion, a force is exerted in a horizontal direction between the glass substrate 5 and the adhesive sheet 51. Here, in cases where the convex sections 61 are distributed unevenly, the convex sections 61 may collapse and a problem is caused that the alignment cannot be achieved. On the contrary, with the convex sections 61 arranged in a hexagonal pattern, a good balance is maintained for the rigidity of the raised portions 61, enabling the raised portions 61 to oppose input of horizontal force over a range of 360°, thereby achieving the alignment with ease. Note that the layout of the raised sections 61 is not limited to the hexagonal pattern as long as a good balance is maintained for the rigidity of the convex section 61 against horizontal force. For example, the raised portions 61 may be disposed in the form of a circle, a rectangle, a polygon (other than hexagon), a line, a wave, or combinations of these.

In the adhesive sheet 51, the ends of the convex sections 61 constituting the respective sides of a hexagon do not meet to form a closed ring. Rather, the convex portions 61 are independently provided. This provides a passageway for the air inside each hexagon formed by the raised portions 61, even when a vacuum atmosphere is created in the surrounding of the glass substrate 5 held by the adhesive sheet 51. On this account, the air inside each hexagon formed by the raised sections 61 does not expand, thereby stably and securely holding the glass substrate 5.

Note that the layout of the convex sections 61 is not limited to the hexagonal pattern as long as a passageway is provided for air. Note also that the suctioning pad sections 62 used for vacuum suction in communication with the through holes 54b of the holding substrate section 54 has a closed structure.

The convex sections 61 and the fine convex sections 64 can be fabricated in accordance with a conventionally wellknown photolithography technique. Alternatively, they may be fabricated by a mechanical method.

In order to hold the glass substrate 5 by the upper substrate holding device 53, the glass substrate 5 is placed directly below the adhesive sheet 51 with the use of substrate carrying means, such as a robot arm (not shown). Then, the space section 54a is evacuated through the evacuation holes 54c of the holding substrate section 54 by using, for example, a vacuum pump. As a result, the air is drawn out through the through holes 63 of the adhesive sheet 51, and the glass substrate 5 is sucked to the suction pad sections 62. Once sucked, the glass substrate 5 is held onto the adhesive sheet 51 by the adhesion on the adhesive faces (lower faces) of the convex sections 61 of the adhesive sheet 51. Note that, this may be carried out using assisting means For example, local suction means, such as a suction pin (not shown), may be lifted down onto the glass substrate 5 from the upper substrate holding device 53, and the glass substrate 5 may be lifted up to the adhesive sheet 51 with the local suction means adhering to or vacuum-sucking the glass substrate 5.

The glass substrate 5 held by the adhesive sheet 51 of the upper substrate holding device 53 is detached from the adhesive sheet 51 by placing substrate carrying means, such as a robot arm (not shown), directly below the glass substrate 5, and then by carrying out an air purge through the through holes 63. This may be carried out by using assisting means. For example, detaching means such as a detaching pin (not shown) may be lifted down to the glass substrate 5 from the upper substrate holding device 53 so as to detach the glass substrate 5 from the adhesive sheet 51.

Figure 16A:
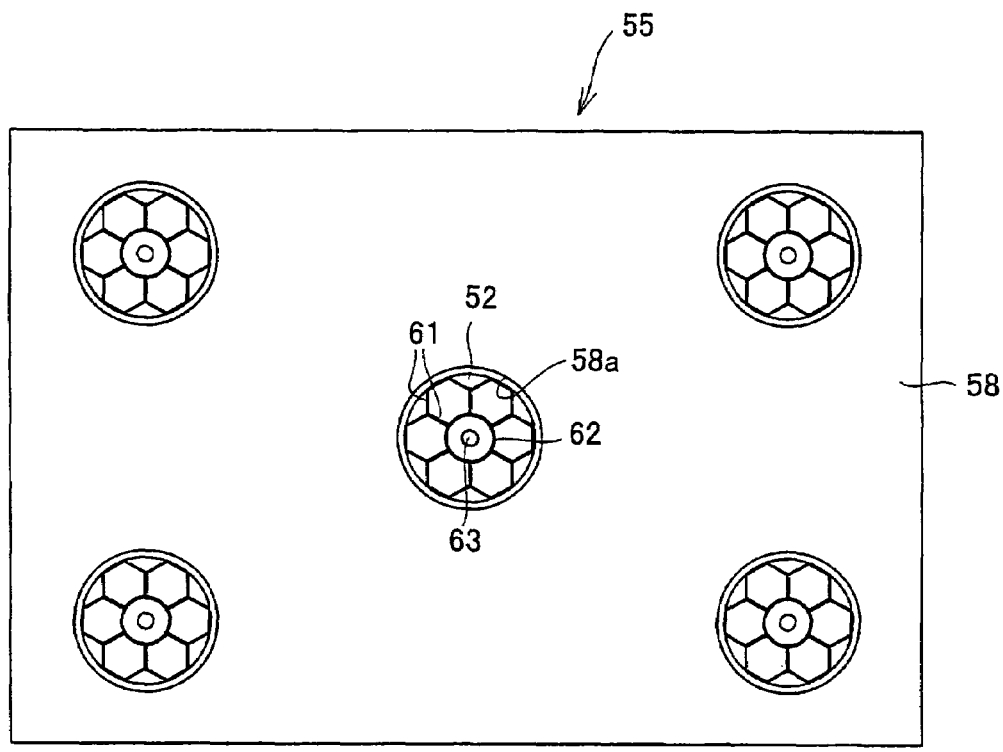
FIG. 16(a) is a plan view illustrating a lower substrate holding device of the substrate assembly device shown in FIG. 13.
Figure 16B:
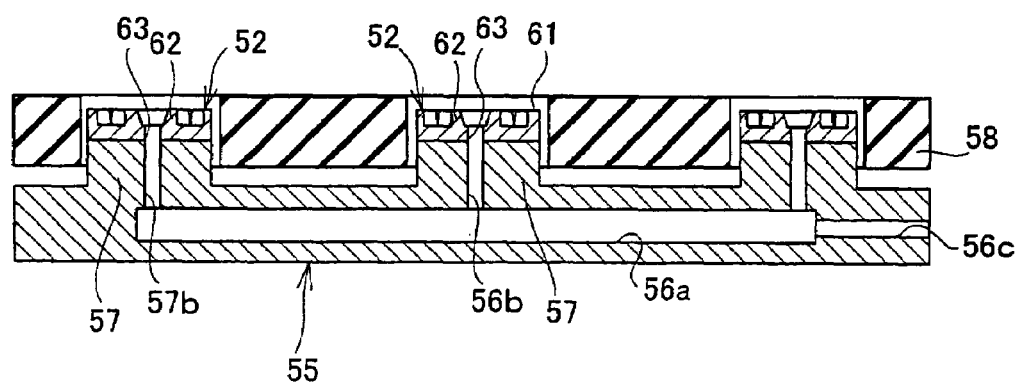
FIG. 16(b) is a longitudinal sectional view of the lower substrate holding device shown in FIG. 16(a).

The adhesive pad 52 has a thin cylindrical shape as shown in FIG. 16(a), which is a plan view illustrating the lower substrate holding device 55, and in FIG. 16(b), which is a longitudinal section of the lower substrate holding device 55. The adhesive pads 52 in the lower substrate holding device 55 are provided in a discrete manner. As in the adhesive sheet 51, each adhesive pad 52 has a plurality of convex sections 61 over its entire upper face (adhesive face). In the central portion on the upper face of the adhesive pad 52 is the suction pad section 62, and the through hole 63 is formed through the central portion of the suction pad section 62. The convex sections 61 are arranged in the same manner as in the adhesive sheet 51. Also, the suction pad section 62 is structured in the same manner as in the adhesive sheet 51.

As in the adhesive sheet 51, the adhesive pad 52 has a total thickness H of a few millimeters as shown in FIG. 14(c), and each of the raised portion 61 has a height h that falls within a range of from 100 µm to 1 mm, or more preferably from 300 µm to 500 µm. The adhesive pad 52 is rubbery and elastic.

Further, as in the adhesive sheet 51, fine raised portions 64 are formed on the adhesive face of each raised portion 61 of the adhesive pad 52, as shown in FIGS. 15(a) and 15(b). The fine raised portions 64 has a depth h that preferably falls within a range of from 10 µm to 100 µm, or more preferably from 20 µm to 40 µm.

In order to hold the glass substrate 3 by the lower substrate holding device 55, the glass substrate 3 is placed directly-above the lower stage 58 with the use of substrate carrying means, such as a robot arm (not shown). Then, a lift pin (not shown) is lifted up from the lower substrate holding device 55 to the glass substrate 3. After the substrate carrying means has released the glass substrate 3 and retreated, the lift pin is brought down. On this occasion, the adhesive pad 52 is lifted up in advance so that its upper face levels with the upper face of the lower stage 58. Then, the space section 56a is evacuated through the evacuation hole 56c of the holding substrate section 56 by using, for example, a vacuum pump. As a result, the air is drawn out through the through holes 63 of the adhesive pad 52, and the glass substrate 5 is sucked to the suction pad sections 62. Once sucked, the glass substrate 3 is held onto the adhesive pad 52 by the adhesion on the adhesive faces (upper faces) of the raised portions 61 of the adhesive pad 52.

The glass substrate 3 held by the adhesive pad 52 of the lower substrate holding device 55 is detached from the adhesive pad 52 by lifting down the adhesive pad 52 with the lower stage 58 fixed on the adhesive pad 52. On this account, the glass substrate 3 can be detached from the adhesive pad 52 with ease. This can be carried out more easily when an air purge is simultaneously carried out through the through holes 63.

As with the foregoing adhesive pads 20, 21, 23 and the adhesive sheet 22, the adhesive sheet 51 or the adhesive pad 52 of the present embodiment is made of a self-adhesive material. That is, no adhesive agent or the like is applied thereon. Specifically, the adhesive sheet 51 and the adhesive pad 52 are made from a material including diene-based resin, and more specifically, made of unsaturated polybutadiene, which is a diene-based resin. Properties and the like of the unsaturated polybutadiene are described above.

When the adhesive sheet 51 and the adhesive pad 52, both of which are made of unsaturated polybutadiene, are A3 size or smaller, they may have a thickness of, for example, about 0.3 mm to about 5 mm. When the adhesive sheet 51 and the adhesive pad 52 are bigger than A3 size, and are not bigger than 730 mm×920 mm, they may have a thickness of, for example, about 1 mm to about 5 mm.

Here, Table 1 below shows the result of measurement on the adhesion of unsaturated polybutadiene with respect to (i) a glass substrate for a liquid crystal panel, (ii) a PES (polyethersulfone) substrate for a liquid crystal panel, called a plastic liquid crystal, and (iii) an epoxy substrate for a liquid crystal panel. For the measurement, an adhesive member made of unsaturated polybutadiene was prepared first. The adhesive member was flat without irregularities, and had a diameter of 20 mm. Then, a pressure of 1.96 N was applied to each target substrate for 10 seconds, and the force required to detach the adhesive member when it is pulled vertically was measured with the use of a push-pull gauge. The numbers in Table 1 are converted values, representing adhesion per square meter.

TABLE 1

Adhesion of polybutadiene (unit: $g/cm^2$)

| | Target substrates | | |
|---|---|---|---|
| Measurement | Glass substrate | PES substrate | Epoxy substrate |
| 1 | 350 | 178 | 166 |
| 2 | 382 | 153 | 134 |
| 3 | 414 | 178 | 188 |
| 4 | 322 | 160 | 175 |
| 5 | 430 | 191 | 160 |
| 6 | 398 | 188 | 134 |
| 7 | 414 | 191 | 143 |
| 8 | 414 | 204 | 146 |
| 9 | 398 | 207 | 178 |
| 10 | 430 | 182 | 156 |
| Average value | 395 | 183 | 158 |

The following description deals with (i) the adhesion actually required for the adhesive sheet 51 and the adhesive pad 52, and (ii) a method for adjusting the adhesion.

When a work to be adhered is the glass substrate 5 having a specific gravity of approximately 2.8 g/cm$^3$ and a thickness of 0.7 mm for use in liquid crystal, the work has a weight per square centimeter of approximately 0.2 g. The adhesive sheet 51 has an adhesion of 395 g/cm$^2$. Therefore, when the entire face of the glass substrate 5 is adhered to the adhesive sheet 51, the adhesion is too large for the glass substrate 5, and additional stress is exerted on the glass substrate 5 while detaching. Therefore, in the adhesive sheet 51 of the present embodiment, the raised portions 61 form the hexagonal pattern with a pitch P of 8.66 mm (See FIG. 15), a length L of 2.2 mm, and a width of 0.5 mm, occupying approximately 5% of an entire area (lower face) of the adhesive sheet 51. Further, fine raised portions 64 are formed so that they occupy 10% of a lower face of each raised portion 61. On this account, only 0.5% of the entire area of the adhesive sheet 51 directly makes contact with the glass substrate 5. Because the raised portions 61 are thus formed in the adhesive sheet 51, the adhesive sheet 51 had an average adhesion of approximately 2 g/cm$^2$. That is, the adhesive sheet 51 of the present embodiment realized an adhesion strong enough to adhere to the glass substrate 5 having a weight of about 0.2 g per square centimeter, but weak enough to allow the glass substrate 5 to be detached without exerting additional stress thereon.

Meanwhile, when the work is an epoxy substrate having a specific gravity of approximately 1.9 g/cm$^3$ and a thickness of 0.4 mm for use in liquid crystal, the work has a weight of approximately 0.08 g per square centimeter. The adhesive sheet 51 has an adhesion of 183 g/cm$^2$. Therefore, when the entire face of the glass substrate 5 adheres to the adhesive sheet 51, the adhesion becomes too strong for the epoxy substrate as in the foregoing case, and additional stress is exerted on the epoxy substrate while detaching. Therefore, in this case, the raised portions 61 form the hexagonal pattern with a pitch P of 8.66 mm (See FIG. 15), a length L of 2.2 mm, and a width of 0.4 mm, occupying approximately 4% of the total area (lower face) of the adhesive sheet 51. Further, fine raised portions 64 are formed so that they occupy approximately 10% of a lower face of each raised portion 61. On this account, only 0.4% of the whole area of the adhesive sheet 51 directly makes contact with the epoxy substrate. Because the raised portions 61 are thus formed in the adhesive sheet 51, the adhesive sheet 51 had an average adhesion of approximately 0.8 g/cm$^2$. That is, the adhesive sheet 51 realized an adhesion strong enough to adhere to the epoxy substrate having a weight of 0.08 g per square centimeter, but weak enough to allow the epoxy substrate to be detached without exerting additional stress thereon.

It should be appreciated that the method by which a proportion of occupied area of the raised portions 61 or fine raised portions 64, and the size of the adhesive sheet 51 or the adhesive pad 52 relative to the work size are adjusted can be applied not only to the glass substrate 5 and the epoxy substrate but also to a variety of works with various specific gravities or shapes such as the PES substrate shown in Table 1

The following description deals with a method for manufacturing the liquid crystal display panel 10 of the liquid crystal display device with a substrate assembly device (substrate holding device) using the adhesive sheet 51 and the adhesive pad 52. As shown in FIG. 17(a), a substrate assembly device 70 used herein includes (i) the upper substrate holding device 53 having the adhesive sheet 51, (ii) the lower substrate holding device 55 having the adhesive pad 52, (iii) the lower stage 58, and (iv) a vacuum chamber 71 which contains these substrates and devices. The upper substrate holding device 53 and the lower substrate device 55 can move up and down. Note that a vacuum pipe and the like for evacuating the vacuum chamber 31 are omitted in the figure.

Firstly, as shown in FIG. 17(a), in the substrate assembly device 70, a door 72 of the vacuum chamber 71 is opened. In the vacuum chamber 71, the upper substrate holding device 53 and the lower substrate holding device 55 are placed with a predetermined space between each other. Beside a port 73 of the vacuum chamber 71, the glass substrate 3 including the pixel electrodes 2, and the glass substrate 5 including the counter electrodes 4 are prepared for entry into the vacuum chamber 71.

Here, the sealing material 6 has been applied on the periphery of the glass substrate 3, and the liquid crystal material 1 has been dropped on a central portion of each area surrounded by the sealing material 6. Note that, in the figure, the sealing material 6 is applied to the glass substrate 3; however, the application of the sealing material 6 is not necessarily limited to this, and the sealing material 6 may be applied to the glass substrate 5 as well.

Next, the glass substrate 5 is placed directly below the adhesive sheet 51 with the use of substrate carrying means, such as a robot arm (not shown) or the like. Then, inside air is drawn out through the through holes 63 of the adhesive sheet 51, thereby holding the glass substrate 5 on the adhesive sheet 51 as shown in FIG. 17(b). This may be carried out by using assisting means For example, local suction means, such as a suction pin (not shown), may be lifted down to the glass substrate 5 from the upper substrate holding device 53, and the glass substrate 5 may be lifted up to the adhesive sheet 51 with the local suction means adhering to or vacuum-sucking the glass substrate 5.

Then, the glass substrate 3 is placed directly above the lower stage 58 with the use of substrate carrying means, such as a robot arm (not shown) or the like. Then, a lift pin (not shown) is lifted up to the glass substrate 3 from the lower substrate holding device 55. After the substrate carrying means has released the glass substrate 3 and retreated, the lift pin is brought down. On this occasion, the adhesive pad 52 has been lifted up such that its upper surface levels with the upper face of the lower stage 58. Then, the air is drawn out through the through holes 63, causing the glass substrate 5 to adhere to and to be held by the adhesive pad 52 as shown in FIG. 17(c).

Figure 18A:
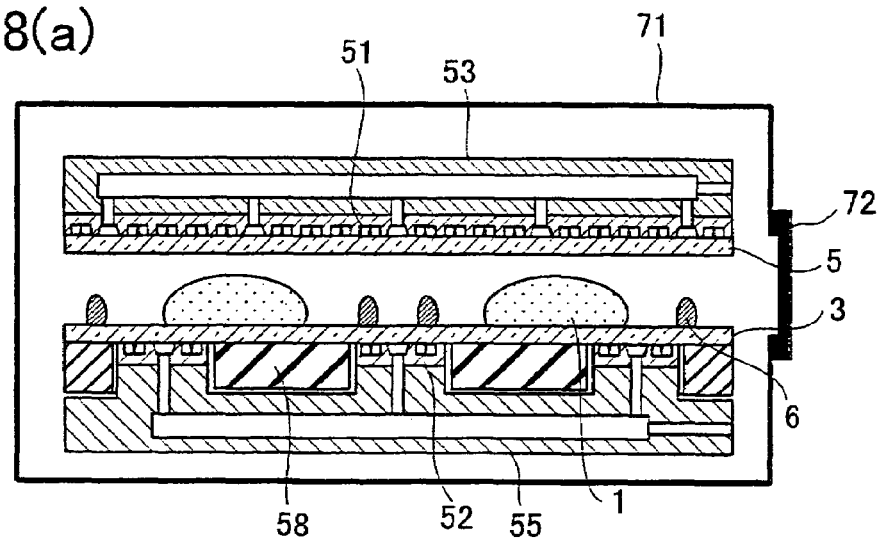
FIG. 18(a) is a cross sectional view showing a state after the state shown in FIG. 17(c), in which a door of a vacuum chamber is closed to evacuate the vacuum chamber.

Then, as shown in FIG. 18(a), the door 72 of the vacuum chamber 71 is closed and the vacuum chamber 71 is evacuated. Here, the adhesive sheet 51 and the adhesive pad 52 made of unsaturated polybutadiene maintain their adhesion even in a vacuum. Further, the adhesive sheet 51 and adhesive pad 52 are stable in a vacuum without generating any gas. Therefore, no problem is posed even when the adhesive sheet 51 and the adhesive pad 52 are exposed in a vacuum when the glass substrates 5 and 3 are assembled together. Furthermore, because the adhesive sheet 51 holds the glass substrate 5, the glass substrate 5 does not fall even after the vacuum suction is released. Further, because the adhesive pad 52 holds the glass substrate 3, misregistration does not occur.

Next, the upper substrate holding device 53 including the adhesive sheet 51 is moved down, and the upper glass substrate 5 and the lower glass substrate 3 are assembled together with position registration. Here, because the glass substrate 5 and the glass substrate 3 are held by the adhesive sheet 51 and the adhesive pad 52, respectively, misregistration does not occur.

Figure 18B:
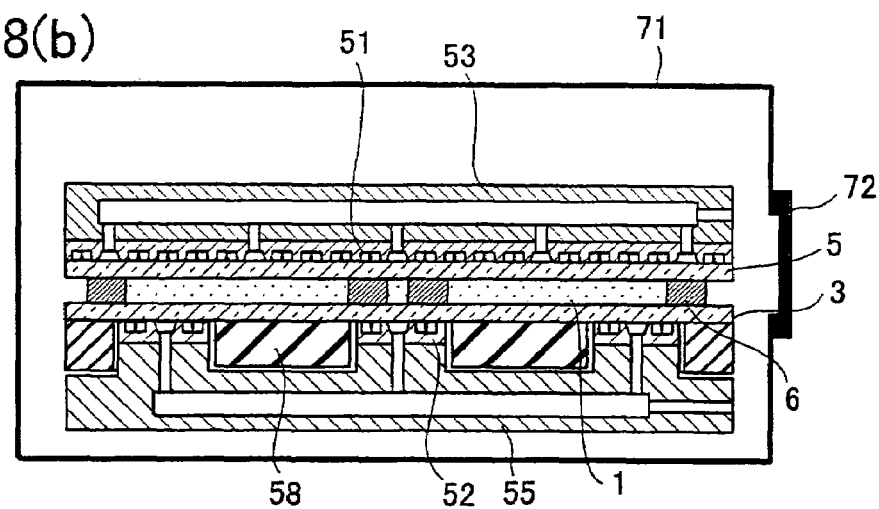
FIG. 18(b) is a cross sectional view illustrating a state at the completion of pressing the substrates.

Then, as shown in FIG. 18(b), the glass substrate 5 and the glass substrate 3 are pressed against each other until a certain distance is achieved therebetween.

Figure 18C:
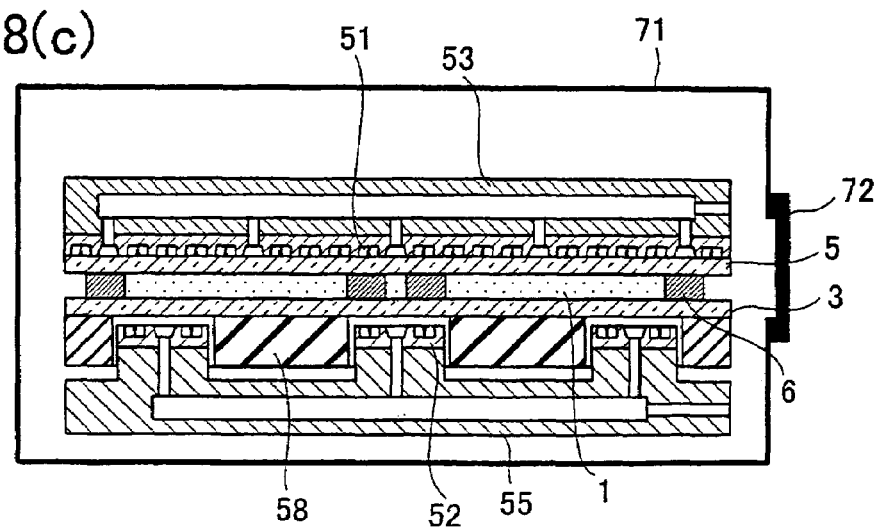
FIG. 18(c) is a cross sectional view illustrating a state in which the adhesive pads of the lower substrate holding device are detached from the lower substrate.

Thereafter, as shown in FIG. 18(c), the adhesive pad 52 (i.e., the lower substrate holding device 55) is moved down with the lower stage 58 fixed to the adhesive pad, thereby detaching the glass substrate 3 from the adhesive pad 52.

Next, as shown in FIG. 19(a), the upper substrate holding device 53 is moved up. Because the glass substrate 5 adheres to the adhesive sheet 51, the upper substrate holding device 53 lifts up the glass substrates 5 and 3 together as an assembly.

Note that, a purge gas such as atmospheric or $N_2$ gas is introduced into the vacuum chamber 71 before the substrate holding device 53 is lifted up as shown in FIG. 19(a) and after the application of pressure shown in FIG. 18(b). With the gas pressure, the upper glass substrate 5 and the lower glass substrate 3 are pressed against each other.

Under this condition, the door 72 of the vacuum chamber 71 is opened, and substrate carrying means, such as a robot arm (not shown), is placed directly below the glass substrates 3 and 5 assembled together. Then, air purge is carried out through the through holes 63 of the adhesive sheet 51, thereby separating the glass substrates 5 and 3 from the substrate carrying means. This places the glass substrates 5 and 3 on the substrate carrying means, and the glass substrates 5 and 3 are taken out of the vacuum chamber 71 with the substrate carrying means, as shown in FIG. 19(b). Note that, the glass substrate 5 may be detached with assistant means. For example, detaching means such as a detaching pin (not shown) may be lifted down from the upper substrate holding device 53 to the glass substrate 5 so as to detach the glass substrate 5 from the adhesive sheet 51.

Then, irradiation of ultraviolet rays and heat sinter are carried out on the assembly of the glass substrates 3 and 5, so as to completely harden the sealing material 6.

Thereafter, the polarizing plates 7 and 8, and reflecting plates 9 made of aluminum and/or the like are attached to the glass substrates 3 and 5, thereby constructing the liquid crystal display panel 10. Then, the liquid crystal display panel is connected to a driving circuit (not shown) and the like, thereby manufacturing a liquid crystal display device.

As described above, the adhesive sheet 51 and the adhesive pad 52, both of which are made from a material including diene-based resin are used in the method for holding a substrate in a vacuum, the method for manufacturing a liquid crystal display device, and the substrate assembly device. The diene-based resin has $CH_2$— at the both ends, thereby obtaining suitable adhesion and detachability when the glass substrates 5 and 3 are held in a vacuum.

Namely, unlike a double-faced adhesive tape to which an adhesive agent is applied, no adhesive agent remains on the glass substrate 5 or 3, and adhesion of the adhesive sheet 51 and the adhesive pad 52 are weak enough to detach from the glass substrates 5 and 3. Therefore, an adhesive agent is prevented from remaining on the glass substrates 5 and 3, and the adhesive sheet 51 and the adhesive pad 52 can be detached with ease from the glass substrates 5 and 3 after the assembly.

Note that, in the present embodiment, the adhesive sheet 51 holds the upper glass substrate 5, and the adhesive sheet 52 holds the lower glass substrate 3; however, the adhesive sheet 51 and the adhesive pad 52 may be used for either of the glass substrates 5 and 3. Alternatively, a fixed adhesive sheet and a movable adhesive pad may be used in combination for, for example, the lower substrate holding device 55.

Further, as with the foregoing First Embodiment, the arrangement of the present embodiment has various advantages, including (a) preventing a change in a characteristic of the TFT element caused by an application of high voltage, because it does not use an electrostatic chuck, (b) simplifying the structure of the substrate assembly device used in a vacuum because the adhesive sheet 51 and the adhesive pad 52 are made from a material including a diene-based resin, or more specifically unsaturated polybutadiene, (c) providing suitable adhesion and detachability for the glass substrates 5 and 3 in a vacuum, and (d) generating no gas and restoring the adhesion by washing with water and drying, even when dust is attached. Further, the present embodiment is applicable not only to a substrate for liquid crystal displays but also to various types of substrates, such as a plasma display substrate, an EL substrate, a plasma address substrate, a field emission display substrate, a silicon ball, and the like.

EXAMPLE 2

A comparative experiment was carried out to examine whether or not the adhesive sheet 51 and the adhesive pad 52 with their raised portions 61 arranged in a hexagonal pattern as described above in this embodiment can evenly apply pressure on the glass substrates.

Figure 20A:
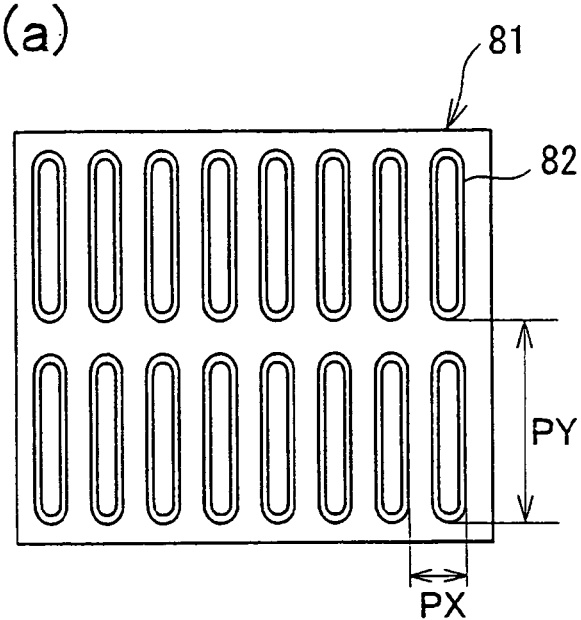
FIG. 20(a) is a plan view illustrating an adhesive sheet as a comparative example of the adhesive sheet shown in FIG. 14.
Figure 20B:
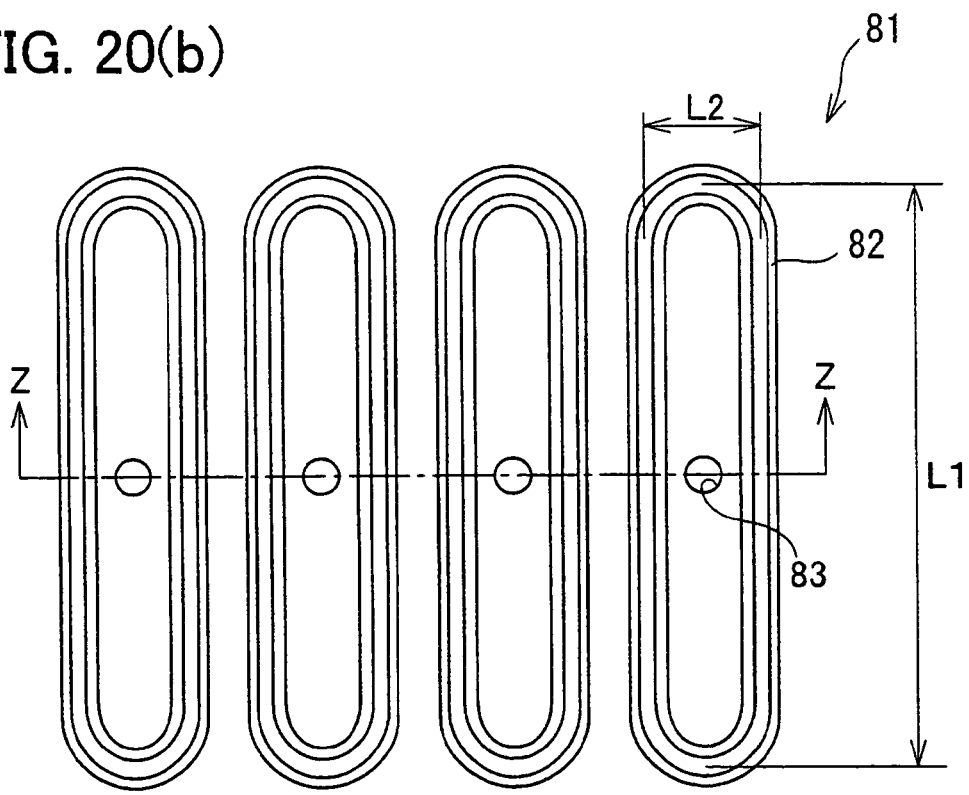
FIG. 20(b) is an enlarged view of FIG. 20(a).
Figure 20C:
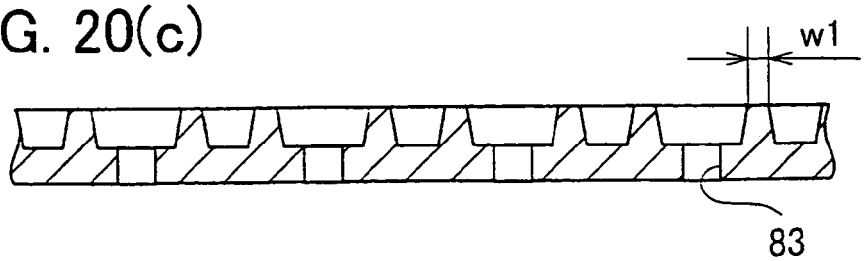
FIG. 20(c) is a cross sectional view taken along the line Z-Z in FIG. 20(b).

In the experiment, an adhesive sheet 81 (shown in FIG. 20(a) through FIG. 20(c)) was formed as a comparative example to the adhesive sheet 51 (shown in FIG. 14(a) through FIG. 14(c)). As shown in FIG. 20(a), which is a plan view of the adhesive sheet 81, on a lower face (adhesive face) of the adhesive sheet 81, a multiplicity of raised portions 82, each having an elliptical shape, are provided side by side with their long sides directed in one direction. The raised portions 82 are equivalent to the raised portions 61 in the adhesive sheet 51. As shown in FIG. 20(b), which is an enlarged view of FIG. 20(a), each of the raised portions 82 has a protruding wall which forms a closed ring. That is, in the adhesive sheet 81, each raised portion is structured to form an elliptical ring. As shown in a cross sectional view taken along the line z-z in FIG. 20(b), a through hole 82 for vacuum suction is provided in a central portion of the ellipsoid formed by each raised portion 82, penetrating through the adhesive sheet 81 in a thickness direction.

The raised portions 82 have a length L1 of the ellipsoid 75 mm, a width L2 of the ellipsoid 15 mm, a width W1 of the protrusion 0.6 mm, a pitch PX of 25 mm in an X direction (width direction of the ellipsoid), and a pitch PY of 100 mm in a Y direction (direction along the long side of the ellipsoid). In this way, the raised portions 82 occupy approximately 4% of the entire area (lower face) of the adhesive sheet 81. Further, fine raised portions 64 were formed on the raised portions 82, occupying approximately 12.5% of the area of the lower face of each raised portion 82. On this account, only 0.5% of the whole area of the adhesive sheet 81 is directly in contact with the glass substrate 5.

Note that, as in Example 1, the unsaturated polybutadiene resin (trade name "APR K-11") of the Asahi Kasei Corporation was used to make the adhesive sheets and the adhesive pads, using the method described in Example 1. Note also that the glass substrates 5 and 3 were assembled together by the method shown in FIG. 17 through FIG. 19.

Note also that, as in the foregoing example, the work (the glass substrates 5 and 3) had a specific gravity of approximately 2.8 g/cm³, a thickness of 0.7 mm, and a weight of approximately 0.2 g per square centimeter.

The result of comparative experiment showed that, as in the foregoing example, the adhesive sheet 51 in which the raised portions 61 were disposed in a hexagonal pattern had an average adhesion of approximately 2 g/cm², and adhered to and securely held the glass substrate 5 having a weight of 0.2 g per square centimeter, thereby enabling the glass substrates 5 and 3 to be desirably assembled together without creating areas of uneven pressure, i.e., uneven cell thickness, caused by the raised portions 61.

On the other hand, the adhesive sheet 81 including the raised portions 82 had an average adhesion of approximately 2 g/cm², and adhered to and securely held the glass substrate 5 having a weight of 0.2 g per square centimeter. However, when the adhesive sheet 81 adhered to the substrate by the vacuum suction through the through holes 83, the glass substrate 5 changed its shape inward at each raised portion 82 having an elliptical shape. This prevented a sufficient pressure from being exerted inside the raised portions 82 when the glass substrates 5 and 3 were assembled together, with the result that uneven cell thickness was caused that causes display defect in the glass substrates 5 and 3

EXAMPLE 3

Figure 21A:
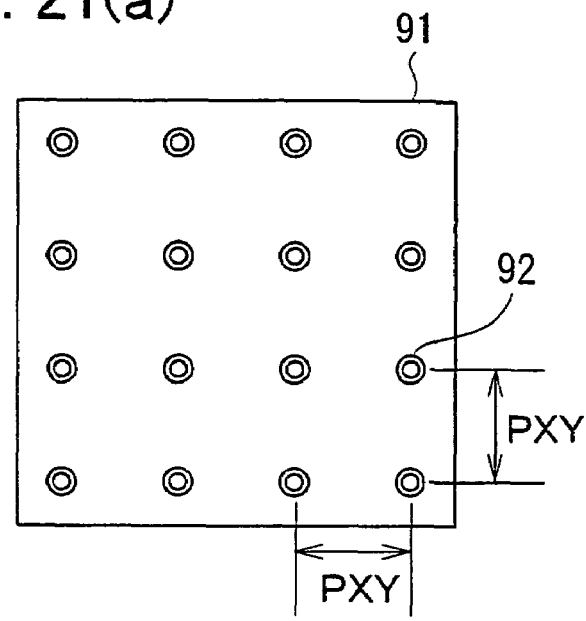
FIG. 21(a) is a plan view illustrating an adhesive sheet as another comparative example of the adhesive sheet shown in FIG. 14.
Figure 21B:
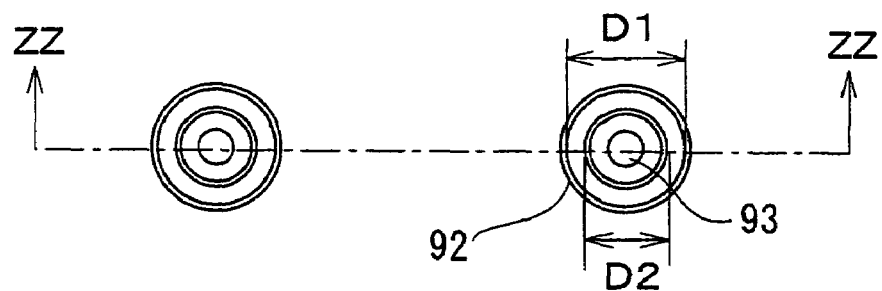
FIG. 21(b) is an enlarged view of FIG. 21(a).
Figure 21C:
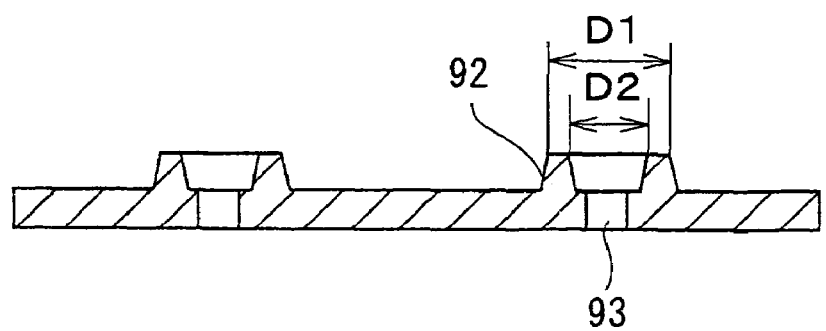
FIG. 21(c) is a cross sectional view taken along the line ZZ-ZZ in FIG. 21(b).

Further, an adhesive sheet 91 (shown in FIG. 21(a) through FIG. 21(c)) was formed as another comparative example of the adhesive sheet 51 (shown in FIG. 14(a) through FIG. 14(c)). As shown in FIG. 21(a), which is a plan view of the adhesive sheet 91, a multiplicity of raised portions 92 were provided on a lower face (adhesive face) of the adhesive sheet 91. The raised portions 92 are equivalent to the raised portions 61 of the adhesive sheet 51. As shown in FIG. 21(b), which is an enlarged view of FIG. 21(a), each of the raised portions 82 has a circular ring shape. As shown in a cross sectional view taken along zz-zz in FIG. 21(b), a through hole 93 for vacuum suction was provided in a central portion of each of the raised portions 92, penetrating through the adhesive sheet 91 in a thickness direction.

The raised portions 92 were formed with an outer diameter D1 of 3 mm as measured at the highest point of the circular ring, an inner diameter D2 of 2 mm, and a pitch PXY of 28 mm. As a result, the raised portions 92 occupied approximately 0.5% of the entire area (lower face) of the adhesive sheet 91. In the raised portions 92, fine raised portions 64 were not formed. Therefore, 0.5% of the whole area of the adhesive sheet 91 was directly in contact with the glass substrate 5.

Note that, as in the Example 1, the unsaturated polybutadiene resin (trade name "APR K-11") of the Asahi Kasei Corporation was used to make the adhesive sheets and adhesive pads by the method described in the Example 1. Note also that the glass substrates 5 and 3 were assembled together by the method shown in FIG. 17 through FIG. 19.

Note also that, as in the foregoing example, the work (glass substrates 5 and 3) had a specific gravity of approximately 2.8 g/cm³, a thickness of 0.7 mm, and a weight of approximately 0.2 g per square centimeter.

The result of comparative experiment showed that, as in the foregoing example, the adhesive sheet 51 in which the raised portions 61 were disposed in a hexagonal pattern had an average adhesion of approximately 2 g/cm², and adhered to and securely held the glass substrate 5 having a weight of approximately 0.2 g per square centimeter, thereby enabling the glass substrates 5 and 3 to be desirably assembled together without creating areas of uneven pressure, i.e., uneven cell thickness, by the raised portions 61.

On the other hand, the adhesive sheet 91 including the raised portions 92 had an average adhesion of approximately 2 g/cm², and adhered to and securely held the glass substrate 5 having a weight of approximately 0.2 g per square centimeter. However, unlike the adhesive sheet 81 with the raised portions 82 having an elliptical shape, the glass substrate 5 did not change its shape inward at each raised portion 92 even when the adhesive sheet 91 adhered to the substrate by the vacuum suction through the through holes 93. However, the pressure of assembly concentrated on the raised portions 92 that occupied 5% of the whole area of the adhesive sheet 91, causing these areas to deform by the strong pressure while the pressure was insufficiently applied to the other areas. As a result, uneven cell thickness is caused that causes display defect in the glass substrates 5 and 3.

It was found as a result that the adhesive sheet 51 and the adhesive pad 52 with their raised portions 61 disposed in a hexagonal pattern were suitable for assembling the glass substrates 5 and 3 with an even cell thickness.

In the foregoing Examples, each raised portion 61 constitutes one side of a hexagon in the honeycomb pattern. However, the arrangement of the raised portion 61 is not limited to this, and the raised portions 61 may constitute at least part of the sides making up the hexagons of the honeycomb pattern. A concrete example thereof is explained below.

Figure 22:
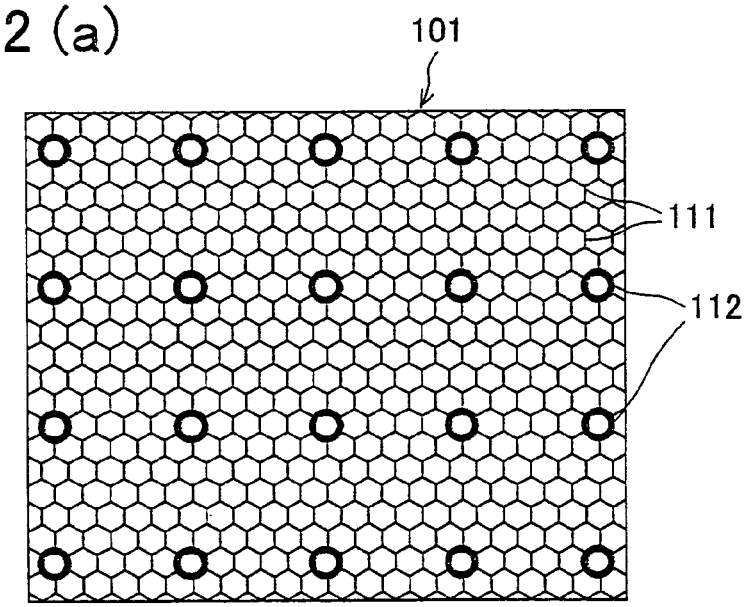
FIG. 22(a) is a plan view illustrating another example of the adhesive sheet provided in the upper substrate holding device of the substrate assembly device shown in FIG. 13.
FIG. 22(b) is an enlarged view of FIG. 22(a).
FIG. 22(c) is a cross sectional view taken along the line XX-XX in FIG. 22(b).
Figure 22:
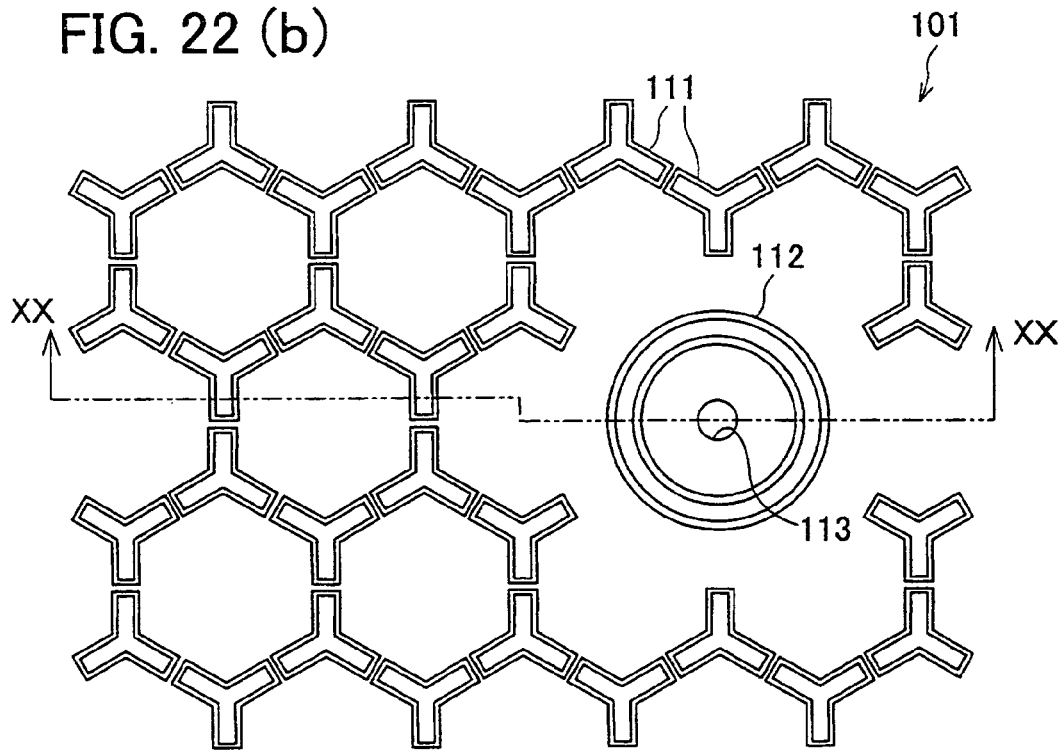
Figure 22:
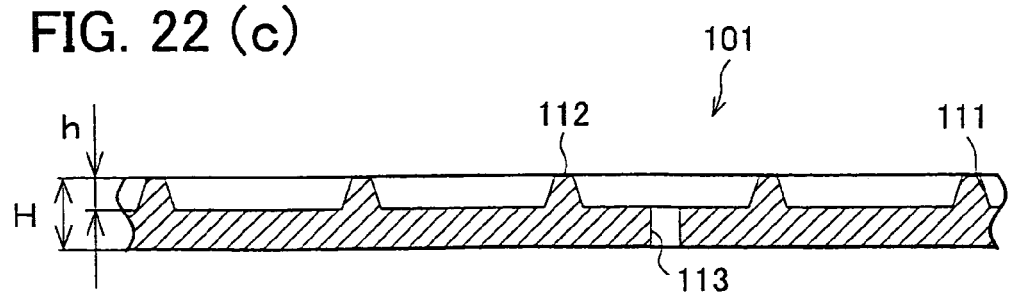

As shown in FIG. 22(a), which is a plan view illustrating, for example, an adhesive sheet 101 that replaces the adhesive sheet 51. A multiplicity of raised portions 111 are formed over the entire lower face (adhesive face) of the adhesive sheet 101. Among the cluster of the raised portions 111, suctioning pad sections 112 are formed that are interspersed at substantially regular intervals.

As shown in FIG. 22(b), which is an enlarged view of FIG. 22(a), the raised portions 111 are provided adjacent to one another in a honeycomb pattern. In particular, each raised portion extends in three directions from an apex of a hexagon in the honeycomb pattern so that the raised portion constitutes at least part of the respective sides of adjacent three hexagons. Further, the raised portions 111 encompass the apexes of the hexagons in the honeycomb pattern. The walls of the raised portions 111 forming the hexagons do not form closed rings, but the hexagons have an open structure, leaving spaces between the raised portions 111. Therefore, as with the raised portions 61, the raised portions 111 are arranged to form hexagons by constituting at least part of the sides of the hexagons.

The suctioning pad sections 112 are provided in the form of a circular ring for example, and have protruding walls that form closed rings. In a central portion of the suctioning pad section 112, a through hole 113 is formed through the adhesive sheet 101 in a thickness direction. The through hole 113 is in communication with the through hole 54b (shown in FIG. 13) of the holding substrate section 54.

The adhesive sheet 101 has a longitudinal section as shown in FIG. 22(c), which is a cross sectional view taken along the line XX-XX in FIG. 22(b). As shown in the figure, the adhesive sheet 101 has a total thickness H of a few millimeters. Each of the raised portions 61 has a height of 100 µm to 1 mm, or more preferably 300 µm to 500 µm. The adhesive sheet 51 is rubbery and elastic.

Further, the adhesive face of each raised portion 111 of the adhesive sheet 101 has fine raised portions, similar to the fine raised portions 64 of the adhesive sheet 51. The fine raised portions have a depth similar to the depth of the fine raised portions 64.

As in the adhesive sheet 51, the shapes (layout) and pitches of the raised portions 111 and the fine raised portions are determined so as to obtain (i) adhesion necessary to hold the substrate, such as the glass substrate 5, in a vacuum, (ii) a pitch which does not cause uneven cell thickness in the glass substrates 5 and 3 when they are assembled together, and (iii) sufficient detachability from the glass substrate 5 after the assembly.

As in the adhesive sheet 51, the raised portions 111 are arranged in a hexagonal pattern for the following reasons. The first reason is to densely dispose the raised portions 111 so as to avoid uneven cell thickness caused by the irregular pattern of the adhesive sheet 101 when the upper glass substrate 5 and the lower glass substrate 3 are assembled together. The second reason is to allow for easy alignment (position registration) of the glass substrates 5 and 3 when they are assembled together.

Namely, when the upper glass substrate 5 and the lower substrate 3 are assembled together, they are aligned in a horizontal direction with the liquid crystal material 1 and the sealing material 11 interposed therebetween. On this occasion, a force is exerted in a horizontal direction between the glass substrate 5 and the adhesive sheet 101. In cases where the raised portions 111 are unevenly distributed, the raised portions 61 may collapse, and a problem caused that the alignment cannot be achieved. On the contrary, when the raised portions 61 are arranged in a hexagonal pattern, a good balance is maintained for the rigidity of the concave sections 61, enabling the raised portions 111 to oppose input of horizontal force over a range of 360°, thereby achieving the alignment with ease.

In the adhesive sheet 101, the ends of the raised portions 111 constituting the respective sides of a hexagon do not meet to form a closed ring. Rather, the raised portions 111 are independently provided. This provides a passageway for the air inside each hexagon formed by the raised portions 111, even when a vacuum atmosphere is created in the surrounding of the glass substrate 5 held by the adhesive sheet 101. On this account, the air inside each hexagon formed by the raised portions 61 does not expand, thereby stably and securely holding the glass substrate 5.

As described above, A method for manufacturing a liquid crystal display device includes the steps of: (i) applying a sealing material for substrate anchorage to one of two substrates that are to be assembled together; (ii) dropping a liquid crystal to one of the two substrates; and (iii) assembling the two substrates in a vacuum, wherein: the two substrates are assembled together in a vacuum by holding an upper one of the substrates with an adhesive pad or adhesive sheet made from a material containing a diene-based resin.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

A method of the present invention for holding a substrate in a vacuum includes the step of: holding a substrate with an adhesive pad or adhesive sheet made from a material containing diene-based resin.

Further, a method of the present invention for manufacturing a liquid crystal display device, comprising the steps of: applying a sealing in material for substrate anchorage to one of two substrates that are to be assembled together; dropping a liquid crystal to one of the two substrates; and assembling the two substrates in a vacuum, wherein: the two substrates are assembled together in a vacuum by holding an upper one of the substrates with an adhesive pad or adhesive sheet made from a material containing a diene-based resin.

Furthermore, to solve the problems, a substrate holding device of the present invention that holds a substrate in a vacuum includes: an adhesive pad or adhesive sheet, made from a material containing a diene-based resin, for holding the substrate.

Therefore, because the adhesive pad and the adhesive sheet have $CH_2$— at the both ends, suitable adhesion and detachability are obtained when holding the substrate in a vacuum Accordingly, it is possible to provide a method for holding a substrate in a vacuum, a method for manufacturing a liquid crystal display device, and a substrate holding device, whereby the adhesive agent is prevented from remaining on the substrate, and the adhesive sheet is detached from the substrate after the assembly.

Further, a method of the present invention for manufacturing a liquid crystal display device, comprising the steps of: applying a sealing material for substrate anchorage to one of two substrates that are to be assembled together; dropping a liquid crystal to one of the two substrates; and assembling the two substrates in a vacuum, wherein: the two substrates are assembled together in a vacuum by holding one of or both of the substrates with an adhesive pad or adhesive sheet made from a material containing diene-based resin and having an adhesive face with surface irregularities.

On this account, the raised portions in the adhesive face with surface irregularities can suitably deform. This ensures that pressure is more evenly exerted over the entire substrate, and the substrate is assembled with the other substrate with a more even space between each other, as compared with an adhesive pad of adhesive sheet which does not have the adhesive face with surface irregularities.

Further, the adhesion that holds the substrates can be adjusted by the shape of irregularities. As a result, the adhesion that holds the substrate does not become too strong, and it does not cause large stress on the substrate when detaching the adhesive pad or adhesive sheet from the substrates.

A substrate holding device of the present invention includes: an adhesive member for holding a substrate, the adhesive member having flexibility and adhesion, and being able to maintain its shape after a release of applied external pressure.

On this account, no adhesive agent remains on the substrate unlike a tape or the like to which an adhesive agent is applied, and a suitable adhesion for holding and detaching from the substrate can be obtained. Therefore, the device is suitable for holding a substrate.

The invention claimed is:

1. A substrate holding device for holding a substrate in a vacuum, comprising:
   an adhesive pad or adhesive sheet, the adhesive pad or the adhesive sheet having an adhesive face with surface irregularities, wherein raised portions of the surface irregularities are arranged in the form of hexagons in a honeycomb pattern, so as to constitute at least part of sides of the hexagons, the hexagons being defined by a plurality of convex portions forming walls spaced apart from one another, wherein the walls do not form a closed ring, and wherein the adhesive pad or the adhesive sheet is made from a material containing a diene-based resin, for holding the substrate.

2. The substrate holding device as set forth in claim 1, wherein:

the diene-based resin is made of unsaturated polybutadiene.

3. The substrate holding device as set forth in claim 1 or claim 2, further comprising:

a stage with a through hole which allows a pad of the adhesive pad to move freely therein, and with a flat face that faces the substrate.

4. The substrate holding device as set forth in claim 3, wherein:

the through hole allows gas to jet therethrough toward a substrate held by the pad of the adhesive pad.

5. The substrate holding device, as set forth in claim 1, wherein:

the surface irregularities of the adhesive pad or the adhesive sheet have the raised portions whose adhesive faces have fine raised portions finer than the raised portions.

6. The substrate holding device, as set forth in claim 1, wherein:

the raised portions are arranged to constitute the respective sides of the hexagons in the honeycomb pattern.

7. The substrate holding device, as set forth in claim 1, wherein:

the raised portions encompass apexes of the hexagons.

8. The substrate holding device, as set forth in claim 7, wherein:

the raised portions each extend in three directions from an apex of the hexagons in the honeycomb pattern, so as to constitute at least part of the sides of three hexagons adjacent to one another.

* * * * *